United States Patent
David et al.

(10) Patent No.: US 9,879,926 B2
(45) Date of Patent: Jan. 30, 2018

(54) CONTROLLED COOLING OF AN ELECTRONIC SYSTEM FOR REDUCED ENERGY CONSUMPTION

(75) Inventors: Milnes P. David, Fishkill, NY (US); Madhusudan K. Iyengar, Foster City, CA (US); Roger R. Schmidt, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 796 days.

(21) Appl. No.: 13/527,863

(22) Filed: Jun. 20, 2012

(65) Prior Publication Data

US 2013/0340994 A1 Dec. 26, 2013

(51) Int. Cl.
- *F28F 27/00* (2006.01)
- *H05K 7/20* (2006.01)
- *G05B 15/02* (2006.01)

(52) U.S. Cl.
CPC .............. *F28F 27/00* (2013.01); *G05B 15/02* (2013.01); *H05K 7/20836* (2013.01); *G05B 2219/2614* (2013.01)

(58) Field of Classification Search
CPC . F28F 27/00; G05B 15/02; G05B 2219/2614; H05K 7/20836
(Continued)

(56) References Cited

U.S. PATENT DOCUMENTS

| | | | |
|---|---|---|---|
| 3,807,493 | A | 4/1974 | Stewart |
| 5,168,921 | A | 12/1992 | Meyer |

(Continued)

FOREIGN PATENT DOCUMENTS

| | | |
|---|---|---|
| CN | 201222836 Y | 4/2009 |
| DE | 19845821 B4 | 4/2000 |

(Continued)

OTHER PUBLICATIONS

Simons et al., "A Survey of Vapor Phase Cooling Systems", EDN Magazine, vol. 14, No. 1, pp. 53-56 (Jan. 1969).

(Continued)

*Primary Examiner* — Miranda Huang
*Assistant Examiner* — John Park
(74) *Attorney, Agent, or Firm* — Margaret A. McNamara, Esq.; Kevin P. Radigan, Esq.; Heslin, Rothenberg, Farley & Mesiti, P.C.

(57) ABSTRACT

Energy efficient control of a cooling system cooling an electronic system is provided. The control includes automatically determining at least one adjusted control setting for at least one adjustable cooling component of a cooling system cooling the electronic system. The automatically determining is based, at least in part, on power being consumed by the cooling system and temperature of a heat sink to which heat extracted by the cooling system is rejected. The automatically determining operates to reduce power consumption of the cooling system and/or the electronic system while ensuring that at least one targeted temperature associated with the cooling system or the electronic system is within a desired range. The automatically determining may be based, at least in part, on one or more experimentally obtained models relating the targeted temperature and power consumption of the one or more adjustable cooling components of the cooling system.

6 Claims, 18 Drawing Sheets

(58) Field of Classification Search
USPC .................................. 700/276–278, 299–300
See application file for complete search history.

(56) References Cited

U.S. PATENT DOCUMENTS

| | | | |
|---|---|---|---|
| 5,202,837 A | 4/1993 | Coe et al. | |
| 5,371,665 A | 12/1994 | Quisenberry et al. | |
| 5,414,591 A | 5/1995 | Kumura et al. | |
| 5,596,507 A | 1/1997 | Jones et al. | |
| 5,794,454 A | 8/1998 | Harris et al. | |
| 6,006,168 A | 12/1999 | Schumann et al. | |
| 6,011,371 A | 1/2000 | Van Brocklin et al. | |
| 6,263,959 B1 | 7/2001 | Ikeda et al. | |
| 6,400,045 B1 | 6/2002 | Hosokawa et al. | |
| 6,411,512 B1 | 6/2002 | Mankaruse et al. | |
| 6,434,000 B1 | 8/2002 | Pandolfi et al. | |
| 6,446,026 B1 | 9/2002 | Dean et al. | |
| 6,462,949 B1 | 10/2002 | Parish et al. | |
| 6,480,014 B1 | 11/2002 | Li et al. | |
| 6,557,354 B1 | 5/2003 | Chu et al. | |
| 6,698,218 B2 | 3/2004 | Goth et al. | |
| 6,775,137 B2 | 8/2004 | Chu et al. | |
| 6,924,981 B2 | 8/2005 | Chu et al. | |
| 6,934,118 B2 | 8/2005 | Hidaka et al. | |
| 6,968,709 B2 | 11/2005 | Goth et al. | |
| 7,002,799 B2 | 2/2006 | Malone et al. | |
| 7,042,726 B2 | 5/2006 | Cader et al. | |
| 7,103,509 B2 | 9/2006 | Shah et al. | |
| 7,151,668 B1 | 12/2006 | Stathakis | |
| 7,218,129 B2 | 5/2007 | Beaman et al. | |
| 7,233,501 B1 | 6/2007 | Ingalz | |
| 7,273,090 B2 | 9/2007 | Crocker et al. | |
| 7,286,355 B2 | 10/2007 | Cheon | |
| 7,310,737 B2 | 12/2007 | Patel et al. | |
| 7,346,468 B2 | 3/2008 | Bashor et al. | |
| 7,365,973 B2 | 4/2008 | Rasmussen et al. | |
| 7,365,985 B1 | 4/2008 | Ni | |
| 7,385,810 B2 | 6/2008 | Chu et al. | |
| 7,388,749 B1 | 6/2008 | Feroli et al. | |
| 7,395,851 B2 | 7/2008 | Lee et al. | |
| 7,436,663 B2 | 10/2008 | Matsushima et al. | |
| 7,440,278 B2 | 10/2008 | Cheng | |
| 7,443,672 B2 | 10/2008 | Peng et al. | |
| 7,450,385 B1 | 11/2008 | Campbell et al. | |
| 7,469,551 B2 | 12/2008 | Tilton et al. | |
| 7,573,714 B2 | 8/2009 | Ali | |
| 7,583,043 B2 | 9/2009 | Chung et al. | |
| 7,595,550 B2 | 9/2009 | Cady et al. | |
| 7,626,820 B1 | 12/2009 | Konshak et al. | |
| 7,660,109 B2 | 2/2010 | Iyengar et al. | |
| 7,684,196 B2 | 3/2010 | Eckberg et al. | |
| 7,701,714 B2 | 4/2010 | Shabany | |
| 7,703,291 B2 | 4/2010 | Bushnik et al. | |
| 7,746,634 B2 | 6/2010 | Hom et al. | |
| 7,791,882 B2 | 9/2010 | Chu et al. | |
| 7,796,393 B2 | 9/2010 | Lengen et al. | |
| 7,796,399 B2 | 9/2010 | Clayton et al. | |
| 7,817,412 B2 | 10/2010 | Sullivan | |
| 7,826,216 B2 | 11/2010 | Moss | |
| 7,830,657 B2 | 11/2010 | Chu et al. | |
| 2,907,406 A1 | 3/2011 | Campbell et al. | |
| 8,027,162 B2 | 9/2011 | Campbell et al. | |
| 8,583,290 B2* | 11/2013 | Campbell .......... | G05D 23/1934 700/282 |
| 2004/0060305 A1 | 4/2004 | Singh et al. | |
| 2004/0109288 A1* | 6/2004 | Beitelmal et al. ............ | 361/687 |
| 2004/0221604 A1 | 11/2004 | Ota et al. | |
| 2005/0049729 A1 | 3/2005 | Culbert et al. | |
| 2005/0109049 A1 | 5/2005 | Chan | |
| 2006/0146497 A1 | 7/2006 | Gauche et al. | |
| 2006/0176186 A1 | 8/2006 | Larson et al. | |
| 2006/0224254 A1 | 10/2006 | Rumi et al. | |
| 2006/0225433 A1 | 10/2006 | Jammu et al. | |
| 2006/0250772 A1 | 11/2006 | Salmonson et al. | |
| 2007/0044493 A1 | 3/2007 | Kearney et al. | |
| 2007/0211430 A1 | 9/2007 | Bechtolsheim | |
| 2007/0300084 A1 | 12/2007 | Goodrum et al. | |
| 2008/0112075 A1 | 5/2008 | Farquhar et al. | |
| 2008/0239564 A1 | 10/2008 | Farquhar et al. | |
| 2008/0245063 A1 | 10/2008 | Tutunoglu et al. | |
| 2008/0259566 A1 | 10/2008 | Fried | |
| 2008/0310105 A1 | 12/2008 | Cheng | |
| 2008/0313492 A1 | 12/2008 | Hansen | |
| 2009/0002951 A1 | 1/2009 | Legen et al. | |
| 2009/0080151 A1 | 3/2009 | Kalms et al. | |
| 2009/0086432 A1 | 4/2009 | Campbell et al. | |
| 2009/0120607 A1 | 5/2009 | Cheon et al. | |
| 2009/0133866 A1 | 5/2009 | Campbell et al. | |
| 2009/0177334 A1 | 7/2009 | Artman et al. | |
| 2009/0219687 A1 | 9/2009 | Lin | |
| 2009/0259347 A1 | 10/2009 | Gross et al. | |
| 2009/0268404 A1 | 10/2009 | Chu et al. | |
| 2009/0277616 A1 | 11/2009 | Cipolla et al. | |
| 2009/0284924 A1 | 11/2009 | Konshak et al. | |
| 2010/0023787 A1* | 1/2010 | Ho ......................... | G06F 1/206 713/320 |
| 2010/0002510 A1 | 2/2010 | Cipolla et al. | |
| 2010/0027220 A1 | 2/2010 | Hughes et al. | |
| 2010/0076607 A1* | 3/2010 | Ahmed .................. | G06F 1/206 700/276 |
| 2010/0085712 A1 | 4/2010 | Hrehor et al. | |
| 2010/0094593 A1 | 4/2010 | Reddy et al. | |
| 2010/0126696 A1 | 5/2010 | Novotny et al. | |
| 2010/0142147 A1 | 6/2010 | Chang et al. | |
| 2010/0175866 A1 | 7/2010 | Tani et al. | |
| 2010/0027452 A1 | 10/2010 | Sri-Jayantha et al. | |
| 2010/0252234 A1 | 10/2010 | Campbell et al. | |
| 2010/0306598 A1 | 12/2010 | Ackaret et al. | |
| 2010/0312415 A1* | 12/2010 | Loucks .................. | G06F 1/206 700/300 |
| 2010/0313590 A1 | 12/2010 | Campbell et al. | |
| 2011/0051372 A1 | 3/2011 | Barringer et al. | |
| 2011/0057803 A1 | 3/2011 | Yamaoka et al. | |
| 2011/0060470 A1 | 3/2011 | Campbell et al. | |
| 2011/0060472 A1 | 3/2011 | Ocondi et al. | |
| 2011/0069454 A1 | 3/2011 | Campbell et al. | |
| 2011/0112694 A1 | 5/2011 | Bash et al. | |
| 2011/0197612 A1 | 8/2011 | Campbell et al. | |
| 2011/0224947 A1 | 9/2011 | Kriss | |
| 2011/0277967 A1 | 11/2011 | Fried et al. | |
| 2011/0315343 A1 | 12/2011 | Campbell et al. | |
| 2011/0315344 A1 | 12/2011 | Campbell et al. | |
| 2011/0315353 A1 | 12/2011 | Campbell et al. | |
| 2011/0315355 A1 | 12/2011 | Campbell et al. | |
| 2011/0317367 A1 | 12/2011 | Campbell et al. | |
| 2012/0120603 A1 | 5/2012 | Campbell et al. | |
| 2013/0340994 A1 | 12/2013 | David et al. | |
| 2013/0340995 A1 | 12/2013 | David et al. | |
| 2013/0340996 A1 | 12/2013 | David et al. | |
| 2013/0345893 A1 | 12/2013 | David et al. | |
| 2014/0123493 A1 | 5/2014 | Campbell et al. | |

FOREIGN PATENT DOCUMENTS

| | | |
|---|---|---|
| GB | 2436669 B | 5/2011 |
| JP | 01077199 A | 3/1989 |
| JP | 2010040886 A | 2/2010 |
| TW | 323643 U | 12/2007 |
| TW | 200937175 A | 9/2009 |
| WO | WO 97/047167 A1 | 12/1997 |
| WO | WO 02/037918 A1 | 5/2002 |
| WO | WO 2007140110 A2 | 12/2007 |
| WO | WO 2010075358 A1 | 7/2010 |

OTHER PUBLICATIONS

Crispell et al., "Use of Liquid Metal to Promote Boiling on Immersed Integrated Circuit Chips", IBM Technical Disclosure Bulletin, IPCOM000058250D, TDB 09-88, pp. 365-366 (Sep. 1, 1988).

Delia et al., "System Cooling Design for the Water-Cooled IBM Enterprise System/900 Processors", IBM Journal of Research and

(56) References Cited

OTHER PUBLICATIONS

Development, vol. 36, No. 4, pp. 791-803 (Jul. 1992).
Mudawar, et al., "Immersion-Cooled Standard Electronic Clamshell Module: A Building Block for Future High-Flux Avionic Systems", Journal of Electronic Packaging, vol. 116, pp. 116-125 (Jun. 1994).
Nelson et al. "Thermal Performance of an Integral Immersion Cooled Multichip Module Package", IEEE on Components, Packages, and Manufacturing Technology—Part A, vol. 17, No. 3, pp. 405-412 (Sep. 1994).
Arent, "Liquid Coolant Distribution Unit with Convertible Air or Water Cooling", IBM Technical Disclosure Bulletin, IP Prior Art Database, ip.com No. IPCOM000044828D (Feb. 6, 2005).
Morgan, "IBM Hints at Triple Redundancy in Power6", (http://www.itjungle.com/breaking/bn032906-story-1.html) (Mar. 29, 2006).
Ellsworth, Jr. et al., "The Evolution of Water Cooling for IBM Larger Server Systems: Back to the Future", IEEE, Piscataway, NJ, 2008 11th Intersociety Conference on Thermal and Thermomechanical Phenomena in Electronic Systems (ITHERM '08), pp. 266-274 (May 2008).
IBM Technical Disclosure, "Highly-Efficient Copper Rail Design for Optimized Cooling of DRAM Modules", IPCOM000184053D (Jun. 9, 2009).
Geisler et al., "Passive Immersion Cooling of 3-D Stacked Dies", IEEE Transactions on Components and Packaging Technologies, vol. 32, No. 3, pp. 557-565 (Sep. 2009).
Forrest et al., "Pressure Effects on the Pool of Boiling of the Fluorinated Ketone", Thermal and Thermomechanical Phenomena in Electronic Systems (ITherm), pp. 1-9 (2010) (No further date information is available).
Rubenstein et al., "Hypbrid Cooled Data Center Using Above Ambient Liquid Cooling", IEEE (2010) (No further date information is available).
Chainer et al., "Thermoelectric-Enhanced, Liquid-Based Cooling of a Multi-Component Electronic System", U.S. Appl. No. 13/102,195, filed May 6, 2011.
Eckberg et al., "Multi-Rack, Door-Mounted Heat Exchanger", U.S. Appl. No. 13/115,404, filed May 25, 2011.
Campbell et al., "Multi-Fluid, Two-Phase Cooling of Electronic Component(s)", U.S. Appl. No. 13/281,945, filed Oct. 26, 2011.
Chainer et al., "Directly Connected Heat Exchanger Tube Section and Coolant-Cooled Structure", U.S. Appl. No. 13/283,933, filed Oct. 28, 2011.
Campbell et al., "Multi-Rack Assembly With Shared Cooling Unit", U.S. Appl. No. 13/285,116, filed Oct. 31, 2011.
Chainer et al., "Dynamically Limiting Energy Consumed by Cooling Apparatus", U.S. Appl. No. 13/305,967, filed Nov. 29, 2011.
David et al., Office Action for U.S. Appl. No. 13/527,909, filed Jun. 20, 2012 (U.S. Patent Publication No. 2013/0345893 A1), dated Nov. 10, 2014 (13 pages).
David et al., Office Action for U.S. Appl. No. 13/775,545, filed Feb. 25, 2013 (U.S. Patent Publication No. 2013/0340996 A1), dated Oct. 20, 2015 (10 pages).
David et al., Office Action for U.S. Appl. No. 13/775,529, filed Feb. 25, 2013 (U.S. Patent Publication No. 2013/0340995 A1), dated Sep. 21, 2015 (17 pages).
David et al., Final Office Action for U.S. Appl. No. 13/775,529, filed Feb. 25, 2013 (U.S. Patent Publication No. 2013/0340995 A1), dated Feb. 17, 2016 (17 pages).

* cited by examiner

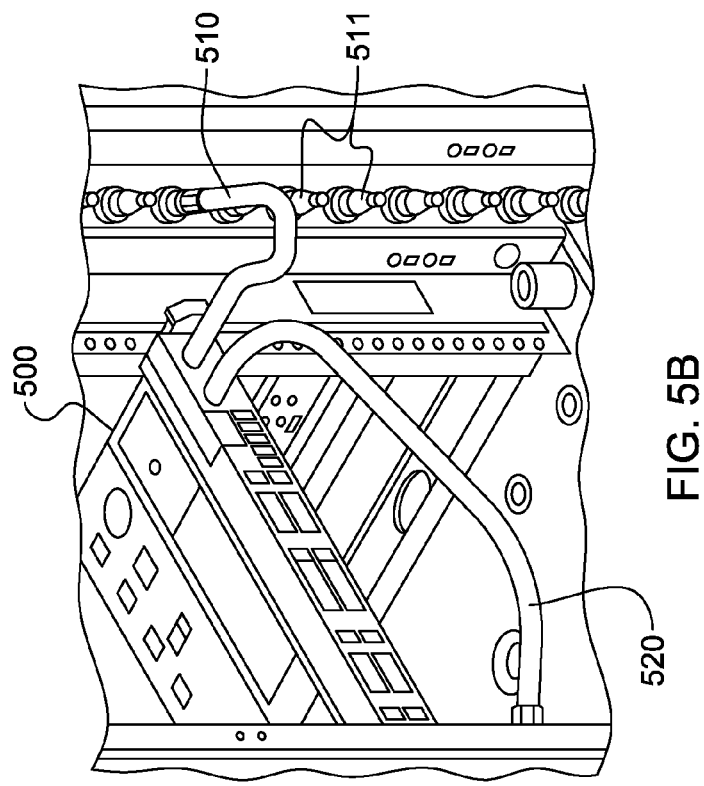
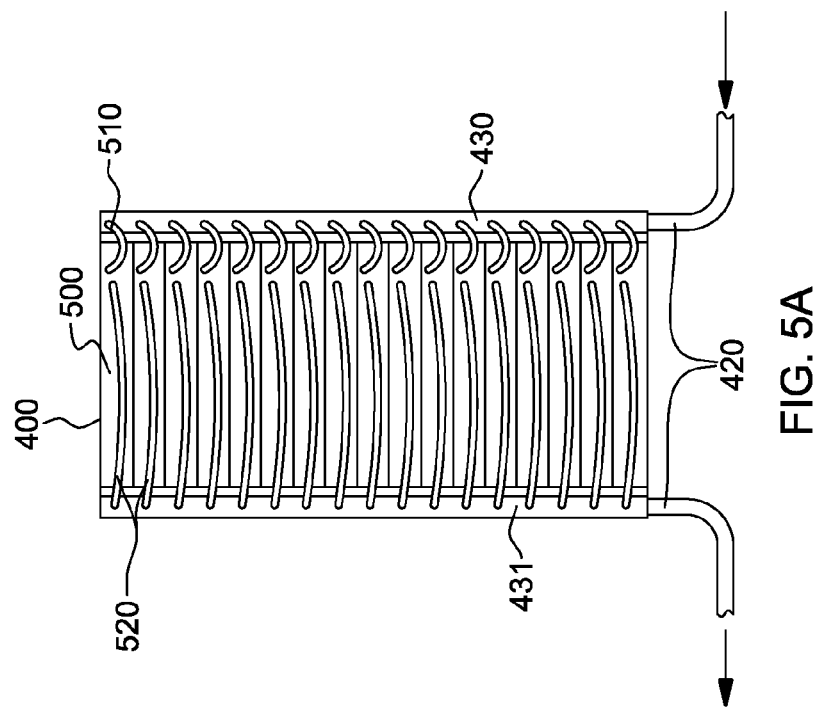

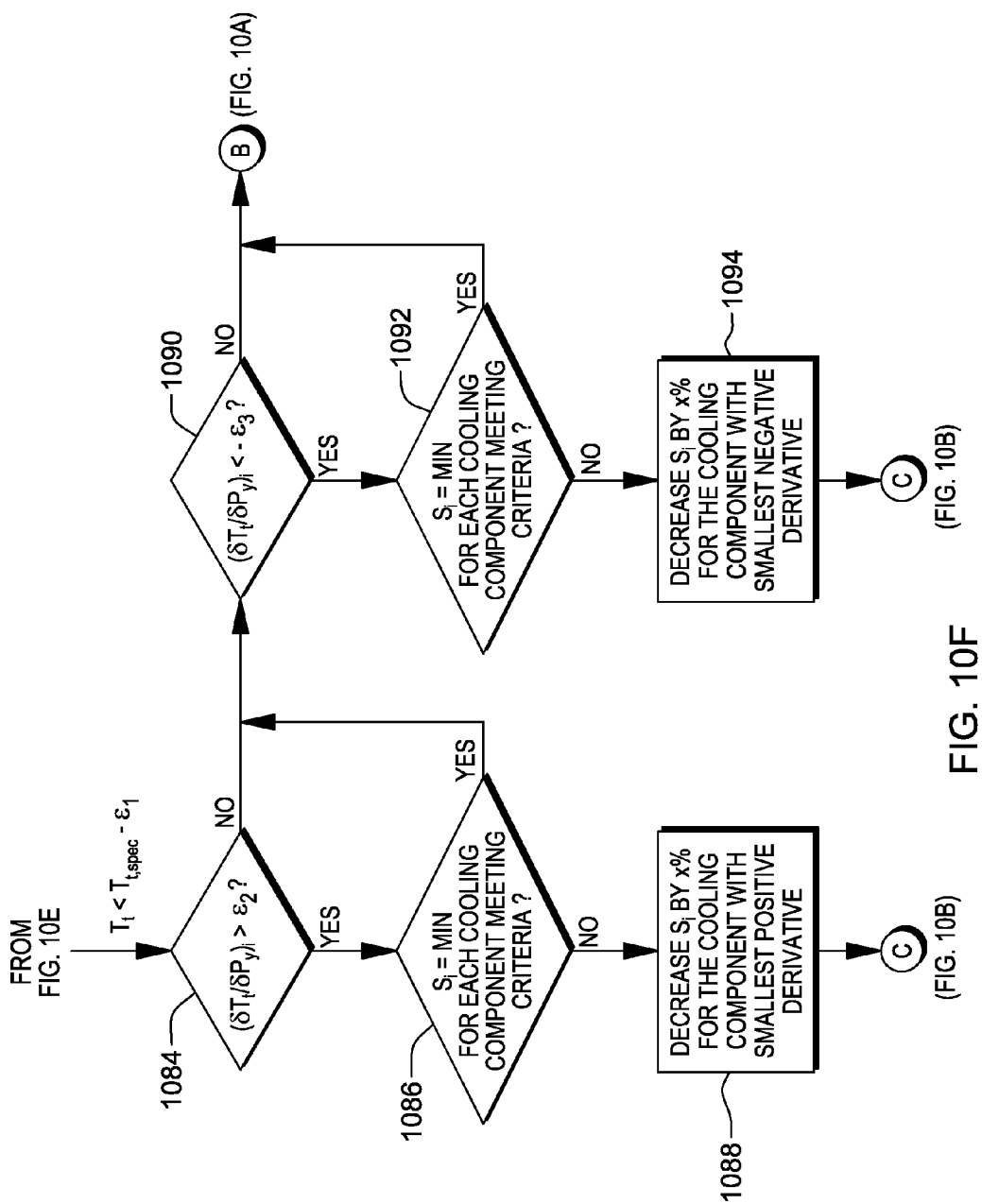

US 9,879,926 B2

CONTROLLED COOLING OF AN ELECTRONIC SYSTEM FOR REDUCED ENERGY CONSUMPTION

STATEMENT REGARDING FEDERALLY SPONSORED RESEARCH

This invention was made with Government support under Contract No. DE-EE0002894, awarded by the Department of Energy. Accordingly, the U.S. Government has certain rights in the invention.

BACKGROUND

As is known, operating electronic components, such as electronic devices, produce heat. This heat should be removed from the devices in order to maintain device junction temperatures within desirable limits, with failure to remove heat effectively resulting in increased device temperatures, and potentially leading to thermal runaway conditions. Several trends in the electronics industry have combined to increase the importance of thermal management, including heat removal for electronic devices, including technologies where thermal management has traditionally been less of a concern, such as CMOS. In particular, the need for faster and more densely packed circuits has had a direct impact on the importance of thermal management. For example, power dissipation, and therefore heat production, increases as device operating frequencies increase. Also, increased operating frequencies may be possible at lower device junction temperatures. Further, as more and more devices are packed onto a single chip, heat flux (Watts/cm$^2$) increases, resulting in the need to remove more power from a given size chip or module. These trends have combined to create applications where it is no longer desirable to remove heat from modern devices, and electronic system containing such devices, solely by traditional air cooling methods, such as by using air cooled heat sinks with heat pipes or vapor chambers. Such air cooling techniques are inherently limited in their ability to extract heat from electronic components with moderate to high power density.

BRIEF SUMMARY

In one aspect, the shortcomings of the prior art are overcome and additional advantages are provided through the provision of a method of controlling cooling of an electronic system. The method includes: automatically determining at least one adjusted control setting for at least one adjustable cooling component of a cooling system cooling the electronic system, the automatically determining being based, at least in part, on power being consumed by the cooling system and temperature of a heat sink to which heat extracted by the cooling system is rejected; and wherein the automatically determining operates to reduce power consumption of at least one of the cooling system or the electronic system, while ensuring that at least one targeted temperature associated with at least one of the cooling system or the electronic system is within a desired range.

In another aspect, a control system is provided for controlling operation of a cooling system cooling an electronic system. The control system includes a memory and a processor coupled to the memory. The processor and the memory are configured to facilitate performing a method which comprises: automatically determining at least one adjusted control setting of at least one adjustable cooling component of a cooling system cooling the electronic system, the automatically determining being based, at least in part, on power being consumed by the cooling system and temperature of a heat sink to which heat extracted by the cooling system is rejected; and wherein the automatically determining operates to reduce power consumption of at least one of the cooling system or the electronic system, while ensuring that at least one targeted temperature associated with at least one of the cooling system or the electronic system is within a desired range.

In a further aspect, a computer program product for controlling cooling of an electronic system is provided. The computer program product includes a computer-readable storage medium readable by a processor and storing instructions for execution by the processor for performing a method. The method includes: automatically determining at least one adjusted control setting for at least one adjustable cooling component of a cooling system cooling the electronic system, the automatically determining being based, at least in part, on power being consumed by the cooling system and temperature of a heat sink to which the heat extracted by the cooling system is rejected; and wherein the automatically determining operates to reduce power consumption of at least one of the cooling system or the electronic system while ensuring that at least one targeted temperature associated with at least one of the cooling system or the electronic system is within a desired range.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 5A is a more detailed, elevational view of one embodiment of the coolant-cooled electronics rack of FIG. 4, and illustrating rack-level coolant distribution structures, in accordance with one or more aspects of the present invention;

FIG. 5B is a partial depiction of a more detailed embodiment of the rack-level coolant distribution structures illustrated in FIG. 5A, in accordance with one or more aspects of the present invention;

FIGS. 10A-10F depict one example of a process for automatically determining one or more adjusted control settings for one or more adjustable cooling components of a cooling system based, in part, on a current control state determined, at least in part, by a current value of the at least one targeted temperature associated with the cooling system or the electronic system, in accordance with one or more aspects of the present invention.

DETAILED DESCRIPTION

Figure 1:
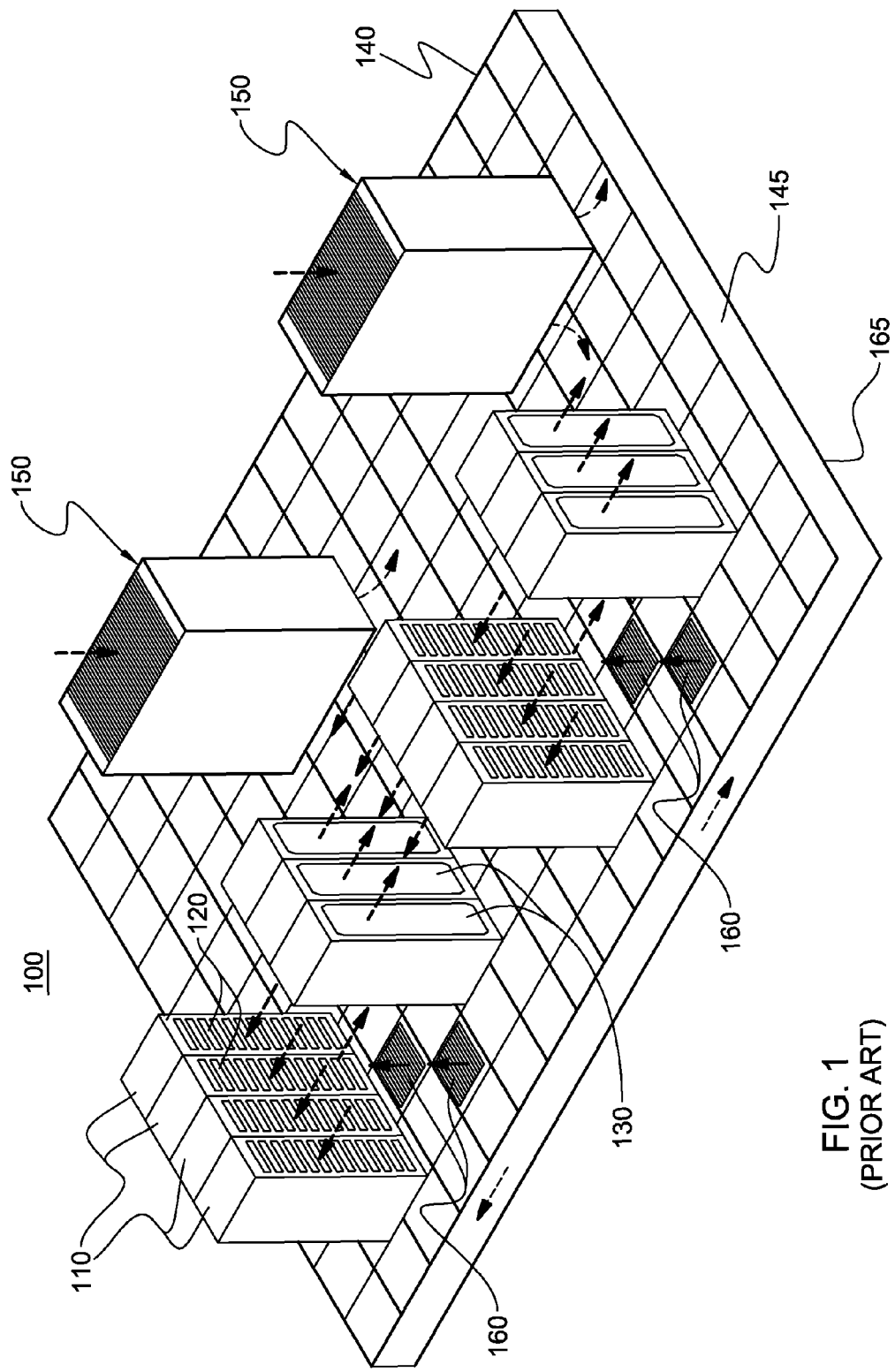
FIG. 1 depicts one embodiment of a conventional raised floor layout of an air-cooled data center.

As used herein, the terms "electronics rack", and "rack unit" are used interchangeably, and unless otherwise specified include any housing, frame, rack, compartment, blade server system, etc., having one or more heat-generating components of a computer system or electronic system, and may be, for example, a stand-alone computer processor having high, mid or low end processing capability. In one embodiment, an electronics rack may comprise a portion of an electronic system, a single electronic system or multiple electronic systems, for example, in one or more sub-housings, blades, books, drawers, nodes, compartments, etc., having one or more heat-generating electronic components disposed therein. An electronic system(s) may be movable or fixed, for example, relative to an electronics rack, with rack-mounted electronic drawers and blades of a blade center system being two examples of electronic systems (or subsystems) of an electronics rack to be cooled.

"Electronic component" refers to any heat-generating electronic component of, for example, a computer system or other electronic system requiring cooling. By way of example, an electronic component may comprise one or more integrated circuit dies, and/or other electronic devices to be cooled, such as one or more electronics cards. In one implementation, an electronics card may comprise a plurality of memory modules (such as one or more dual in-line memory modules (DIMMs)).

Further, as used herein, the terms "coolant-cooled structure", "coolant-cooled cold plate" and "coolant-cooled cold rail" refer to structures having one or more channels (or passageways) formed therein or passing therethrough, which facilitate the flow of coolant (such as liquid coolant) through the structure. A coolant-cooled structure may be, for example, a coolant-cooled cold plate, or a coolant-cooled cold rail, or a coolant manifold. In one example, tubing is provided extending through the coolant-cooled structure. An "air-to-coolant heat exchanger" or "air-to-coolant heat exchange assembly" means any heat exchange mechanism characterized as described herein through which coolant can circulate; and includes, one or more discrete air-to-coolant heat exchangers coupled either in series or in parallel. An air-to-coolant heat exchanger may comprise, for example, one or more coolant flow paths, formed of thermally conductive tubing (such as copper or other tubing) in thermal or mechanical contact with a plurality of air-cooled cooling fins. Size, configuration and construction of the air-to-coolant heat exchanger can vary without departing from the scope of the invention disclosed. Still further, "data center" refers to a computer installation containing one or more electronics racks to be cooled. As a specific example, a data center may comprise one or more rows of rack-mounted computer units, such as server units.

One example of coolant used within the cooling systems and cooled electronic systems disclosed herein is water. However, the concepts presented are readily adapted to use with other types of coolant. For example, the coolant may comprise a brine, a glycol mixture, a fluorocarbon liquid, or other coolant, or refrigerant, while still maintaining the advantages and unique features of the present invention.

Reference is made below to the drawings, which are not drawn to scale for ease of understanding, wherein the same reference numbers used throughout different figures designate the same or similar components.

FIG. 1 depicts a raised floor layout of an air cooled data center 100 typical in the prior art, wherein multiple electronics racks 110 are disposed in one or more rows. A data center such as depicted in FIG. 1 may house several hundred, or even several thousand microprocessors. In the arrangement illustrated, chilled air enters the computer room via perforated floor tiles 160 from a supply air plenum 145 defined between the raised floor 140 and a base or sub-floor 165 of the room. Cooled air is taken in through louvered covers at air inlet sides 120 of the electronics racks and expelled through the back (i.e., air outlet sides 130) of the electronics racks. Each electronics rack 110 may have one or more air moving devices (e.g., fans or blowers) to provide forced inlet-to-outlet airflow to cool the electronic devices within the rack unit. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within the data center 100. Room air is taken into each air conditioning unit 150 near an upper portion thereof. This room air may comprise, in part, exhausted air from the "hot" aisles of the computer installation defined, for example, by opposing air outlet sides 130 of the electronics racks 110.

Figure 2:
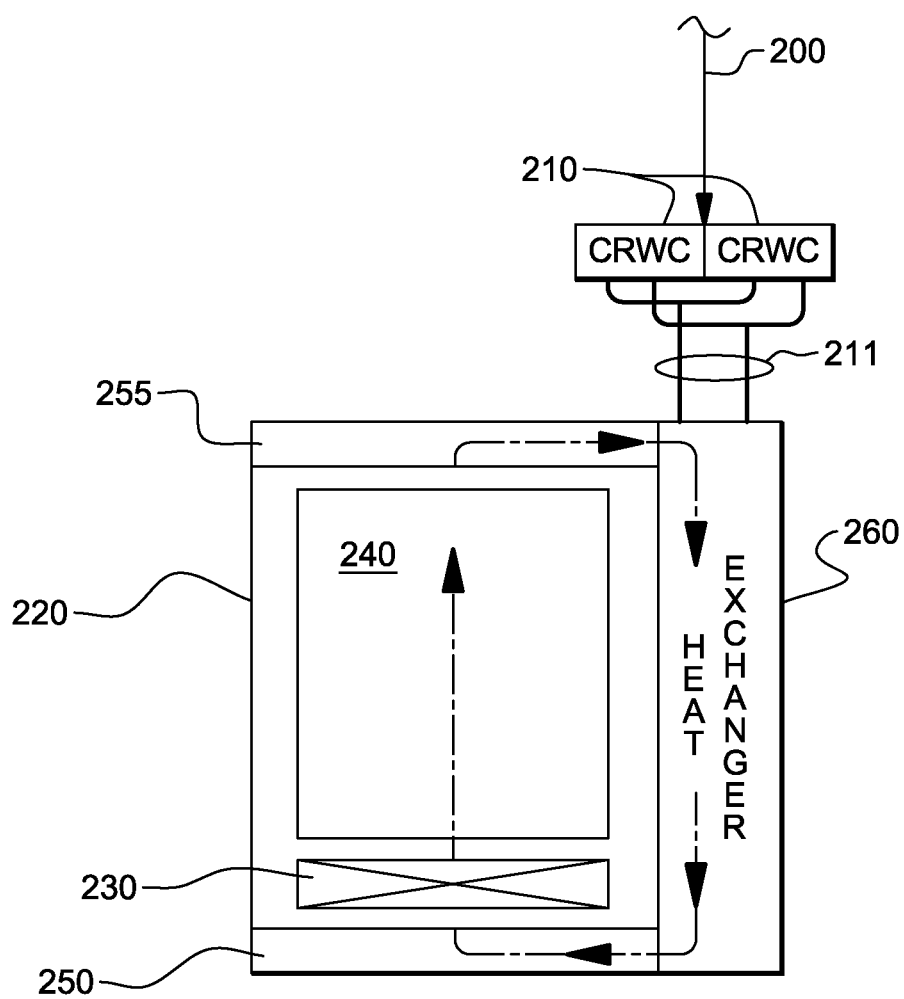
FIG. 2 is a cross-sectional plan view of one embodiment of an electronics rack with an attached air-to-liquid heat exchanger enhancing cooling of air passing through the electronics rack.
Figure 3:
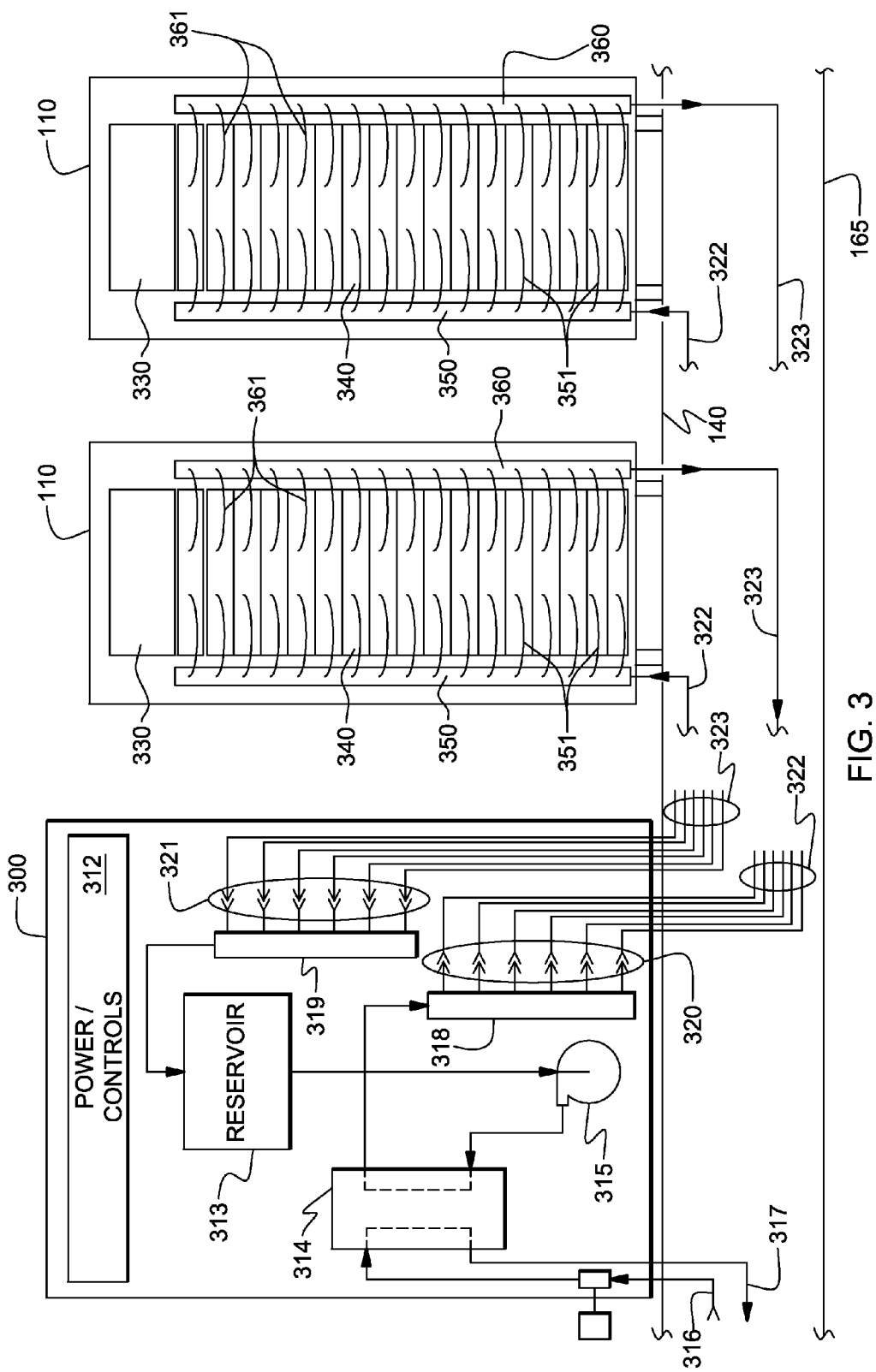
FIG. 3 depicts one embodiment of a data center with a coolant distribution unit facilitating liquid-cooling of one or more coolant-cooled electronics racks of the data center, in accordance with one or more aspects of the present invention.
Figure 4:
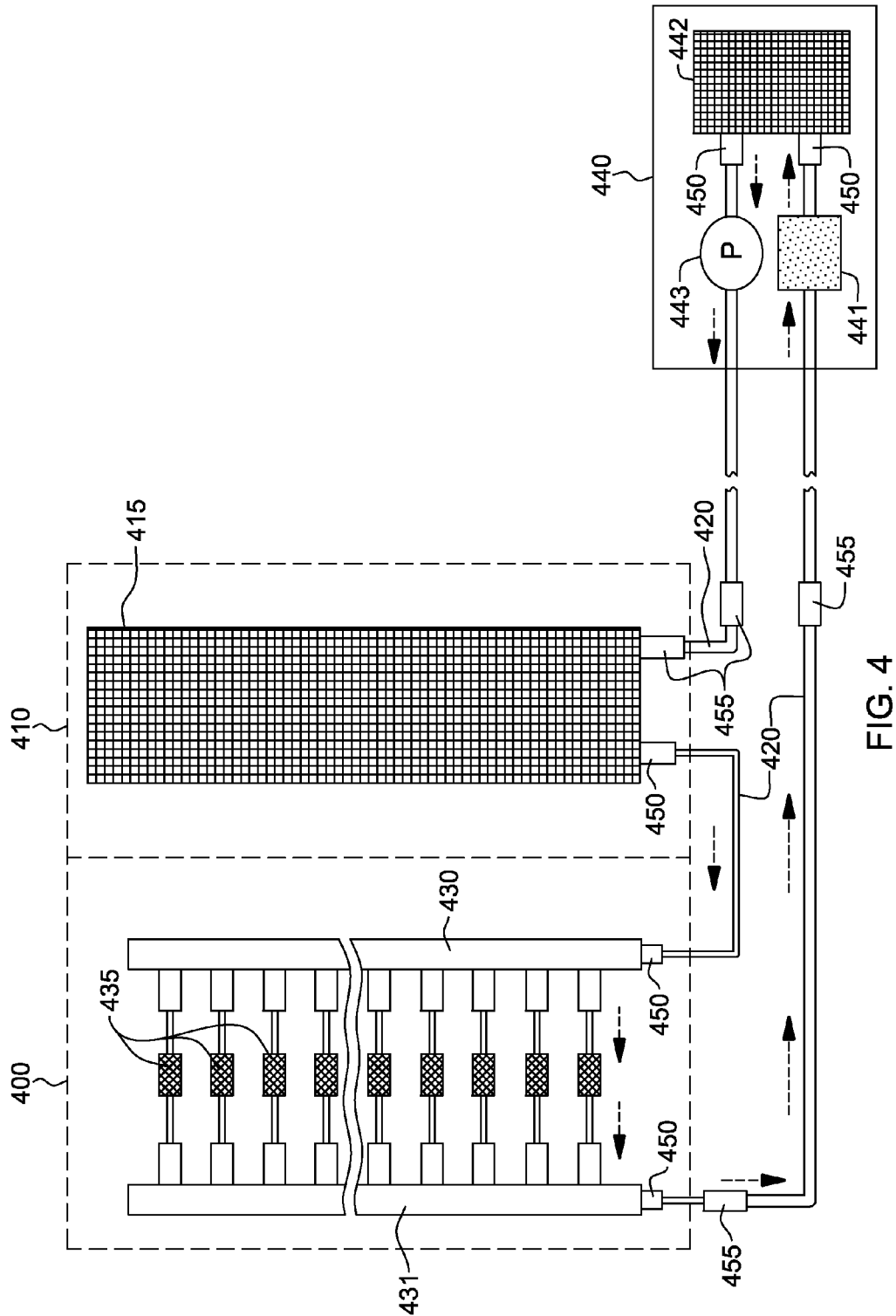
FIG. 4 depicts an alternate embodiment of a cooling system and coolant-cooled electronics system, in accordance with one or more aspects of the present invention.

Due to ever-increasing air flow requirements through electronics racks, and the limits of air distribution within a typical data center installation, liquid-coolant-based cooling is being combined with conventional air-cooling. FIGS. 2-4 illustrate various embodiments of a data center implementation employing such a coolant-based cooling system.

FIG. 2 depicts one rack-level coolant-cooling solution which utilizes (by way of example) chilled facility water to remove heat from the computer installation room, thereby transferring the cooling burden from the air-conditioning unit(s) to the building's chilled water coolers. The embodiment depicted in FIG. 2 is described in detail in commonly assigned, U.S. Pat. No. 6,775,137. Briefly summarized, facility-chilled water 200 circulates through one or more liquid-to-liquid heat exchangers 210, coupled via a system coolant loop 211, to individual electronics racks 220 within the computer room. Rack unit 220 includes one or more air-moving devices 230 for moving air flow from an air inlet side to an air outlet side across one or more drawer units 240 containing heat-generating electronic components to be cooled. In this embodiment, a front cover 250 attached to the rack covers the air inlet side, a back cover 255 attached to the rack covers the air outlet side, and a side car disposed adjacent to (and/or attached to) the rack includes a heat exchanger 260 for cooling air circulating through the rack unit. Further, in this embodiment, the liquid-to-liquid heat exchangers 210 are multiple computer room water-conditioning (CRWC) units which are coupled to receive building chilled facility water 200. The building chilled facility water is used to cool the system coolant within system coolant loop 211, which is circulating through air-to-liquid heat exchanger 260. The rack unit in this example is assumed to comprise a substantially enclosed housing, wherein the same air circulates through the housing that passes across the air-to-liquid heat exchanger 260. In this manner, heat generated within the electronics rack is removed from the enclosed housing via the system coolant loop, and transferred to the facility coolant loop for removal from the computer installation room.

FIG. 3 depicts another embodiment of a rack-level, coolant-cooling solution, which again uses chilled facility water to remove heat from the computer installation room, thereby transferring the cooling burden from the air-conditioning unit(s) to the building's chilled water coolers. In this implementation, one embodiment of a coolant distribution unit 300 for a data center is illustrated. Within coolant distribution unit 300 is a power/control element 312, a reservoir/expansion tank 313, a liquid-to-liquid heat exchanger 314, a pump 315 (often accompanied by a redundant second pump), facility water inlet 316 and outlet 317 supply pipes, a supply manifold 318 supplying water or system coolant to the electronics racks 110 via couplings 320 and lines 322, and a return manifold 319 receiving water or system coolant from the electronics racks 110, via lines 323 and couplings 321. Each electronics rack includes (in one example) a power/control unit 330 for the electronics rack, multiple electronic systems or subsystems 340, a system coolant supply manifold 350, and a system coolant return manifold 360. As shown, each electronics rack 110 is disposed on raised floor 140 of the data center with lines 322 providing system coolant to system coolant supply manifolds 350 and lines 323 facilitating return of system coolant from system coolant return manifolds 360 being disposed in the supply air plenum beneath the raised floor.

In the embodiment illustrated, system coolant supply manifold 350 provides system coolant to cooling apparatuses disposed within the electronic systems or subsystems (for example, to coolant-cooled cold plates or cold rails) via flexible hose connections 351, which are disposed between the supply manifold and the respective electronic systems within the rack. Similarly, system coolant return manifold 360 is coupled to the electronic systems via flexible hose connections 361. Quick connect couplings may be employed at the interface between flexible hoses 351, 361 and the individual electronic systems. By way of example, these quick connect couplings may comprise various types of commercially available quick connect/disconnect couplings.

Although not shown, electronics rack 110 may also include an air-to-coolant heat exchanger, for example, disposed at an air outlet side thereof, which also receives system coolant from the system coolant supply manifold 350 and returns system coolant to the system coolant return manifold 360.

FIG. 4 illustrates another embodiment of a coolant-cooled electronics rack and cooling system therefor, in accordance with one or more aspects of the present invention. In this embodiment, the electronics rack 400 has a side car structure 410 associated therewith or attached thereto, which includes an air-to-coolant heat exchanger 415 through which air circulates from an air outlet side of electronics rack 400 towards an air inlet side of electronics rack 400, for example, in a closed loop path in a manner similar to that illustrated above in connection with the cooling implementation of FIG. 2. In this example, the cooling system comprises an economizer-based, warm-liquid coolant loop 420, which comprises multiple coolant tubes (or lines) connecting, in the example depicted, air-to-coolant heat exchanger 415 in series fluid communication with a coolant supply manifold 430 associated with electronics rack 400, and connecting in series fluid communication, a coolant return manifold 431 associated with electronics rack 400, a cooling unit 440 of the cooling system, and air-to-coolant heat exchanger 415.

As illustrated, coolant flowing through warm-liquid coolant loop 420, after circulating through air-to-coolant heat exchanger 415, flows via coolant supply plenum 430 to one or more electronic systems of electronics rack 400, and in particular, one or more cold plates and/or cold rails 435 associated with the electronic systems, before returning via coolant return manifold 431 to warm-liquid coolant loop 420, and subsequently to a cooling unit 440 disposed (for example) outdoors from the data center. In the embodiment illustrated, cooling unit 440 includes a filter 441 for filtering the circulating coolant, a condenser (or air-to-coolant heat exchanger) 442 for removing heat from the coolant, and a pump 443 for returning the coolant through warm-liquid coolant loop 420 to air-to-coolant heat exchanger 415, and subsequently to the coolant-cooled electronics rack 400. By way of example, hose barb fittings 450 and quick disconnect couplings 455 may be employed to facilitate assembly or disassembly of warm-liquid coolant loop 420.

In one example of the warm coolant-cooling approach of FIG. 4, ambient temperature might be 30° C., and coolant temperature 35° C. leaving the air-to-coolant heat exchanger 442 of the cooling unit. The cooled electronic system depicted thus facilitates a chiller-less data center. Advantageously, such a coolant-cooling solution provides highly energy efficient cooling of the electronic system(s) of the electronics rack, using coolant (e.g., water), that is cooled via circulation through the air-to-coolant heat exchanger located outdoors (i.e., a dry cooler) with external ambient air being pumped through the dry cooler. Note that this warm coolant-cooling approach of FIG. 4 is presented by way of example only. In alternate approaches, cold coolant-cooling could be substituted for the cooling unit 440 depicted in FIG. 4. Such cold coolant-cooling might employ building chilled facility coolant to cool the coolant flowing through the coolant-cooled electronics rack, and associated air-to-coolant heat exchanger (if present), in a manner such as described above in connection with FIGS. 2 & 3.

FIGS. 5A & 5B depict in greater detail one embodiment of a coolant-cooled electronics rack, such as depicted in FIG. 4, in accordance with one or more aspects of the present invention. In this implementation, coolant-cooled electronics rack 400 comprises a plurality of electronic systems 500, within which one or more electronic components are to be coolant-cooled via, for example, one or more cold plates or cold rails, as described below. The cooling system includes coolant loop 420 coupled in fluid communication with coolant supply manifold 430 and coolant return manifold 431, both of which may comprise vertically-oriented manifolds attached to coolant-cooled electronics rack 400. In this embodiment, the rack-level coolant distribution system further includes individual node-level supply hoses 510 supplying coolant from coolant supply manifold 430 to cold plates and cold rails within the electronic systems 500. As shown in FIG. 5B, coolant supply manifold 430 may be (in one embodiment) a vertically-oriented manifold with a plurality of coupling connections 511 disposed along the manifold, one for each electronic system 500 having one or more electronic components to be coolant-cooled. Coolant leaves the individual electronic systems 500 via node-level return hoses 520, which couple the individual electronic systems (or nodes) to coolant return manifold 431, and hence, to coolant loop 420. In the embodiment illustrated in FIG. 4, relatively warm coolant, such as water, is supplied from the cooling unit, either directly, or through one or more air-to-coolant heat exchanger(s) 415 (of FIG. 4), and hot coolant is returned via the coolant return manifold to the cooling unit. In one embodiment of the rack-level coolant distribution system illustrated in FIGS. 5A & 5B, the node-level supply and return hoses 510, 520 are flexible hoses.

Figure 6:
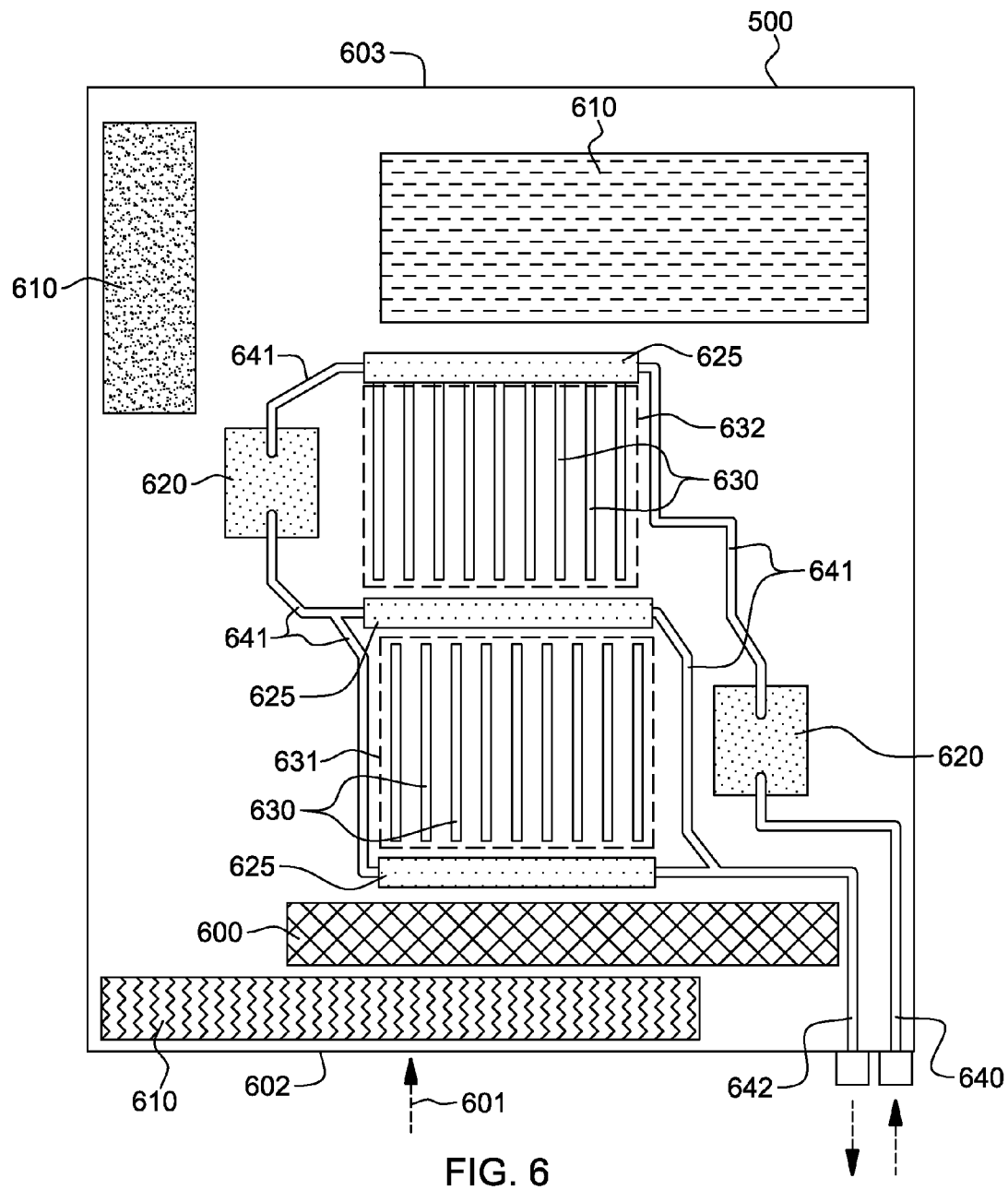
FIG. 6 is a plan view of one embodiment of an electronic system layout for a coolant-cooled electronics rack, and illustrating multiple coolant-cooled cold plates and multiple coolant-cooled cold rails coupled in fluid communication, in accordance with one or more aspects of the present invention.

FIG. 6 illustrates one embodiment of a cooled electronic system 500 component layout, wherein one or more air-moving devices 600 provide forced air flow 601 to cool multiple components 610 within electronic system 500. Cool air is taken in through a front 602 and exhausted out a back 603 of the electronic system (or drawer). The multiple components to be cooled include, for example, multiple processor modules to which coolant-cooled cold plates 620 (of the coolant-based cooling apparatus) are coupled, as well as multiple arrays 631, 632 of electronics cards 630 (e.g., memory modules such as dual in-line memory modules (DIMMs)), which are to be thermally coupled to one or more coolant-cooled cold rails 625. As used herein "thermally coupled" refers to a physical thermal transport path being established between components, for example, between an electronics card and a coolant-cooled cold rail for the conduction of heat from one to the other.

The illustrated coolant-based cooling approach further includes multiple coolant-carrying tubes connecting in fluid communication coolant-cooled cold plates 620 and coolant-cooled cold rails 625. These coolant-carrying tubes comprise (for example), a coolant supply tube 640, multiple bridge tubes 641, and a coolant return tube 642. In the embodiment illustrated, bridge tubes 641 connect one coolant-cooled cold rail 625 in series between the two coolant-cooled cold plates 620, and connect in parallel two additional coolant-cooled cold rails 625 between the second coolant-cooled cold plate 620 and the coolant return tube 642. Note that this configuration is provided by way of example only. The concepts disclosed herein may be readily adapted to use with various configurations of cooled electronic system layouts. Note also, that as depicted herein, the coolant-cooled cold rails are elongate, thermally conductive structures comprising one or more channels through which liquid coolant passes, for example, via one or more tubes extending through the structures. The coolant-cooled cold rails are disposed, in the embodiment illustrated, at the ends of the two arrays (or banks) 631, 632 of electronics cards 630, and multiple thermal spreaders are provided coupling in thermal communication electronics cards 630 and coolant-cooled cold rails 625.

By way of further enhancement, disclosed hereinbelow with reference to FIGS. 7A-10F are novel model-based control methodologies which employ, in one embodiment, one or more experimentally generated thermal model(s) and energy (or power) model(s) of a cooled electronic system comprising an electronic system and a cooling system, to determine a set of one or more adjusted control settings for the cooling system based on, for example, measured electronic system (or more generally, electronic rack or data center) load, as well as one or more heat sink conditions, such as the outdoor ambient temperature in the case where extracted heat is rejected by the cooling system to the outdoor ambient air. As explained herein, the cooling control (in one embodiment) is model-based, and can react dynamically to changes in power loads and heat sink conditions.

For instance, disclosed herein below is a method of controlling cooling of an electronic system, which includes automatically determining at least one adjusted control setting for at least one adjustable cooling component of a cooling system cooling the electronic system. The automatically determining is based, at least in part, on power being consumed by the cooling system and a temperature of a heat sink to which heat extracted by the cooling system is rejected. The automatically determining operates to reduce power consumption of at last one of the cooling system or the electronic system, while ensuring that at least one targeted or controlled temperature associated with at least one of the cooling system or the electronic system is within a desired range. By way of example, the targeted temperature may be a coolant temperature, for example, at the inlet to the electronic system (such as an electronics rack).

Figure 7A:
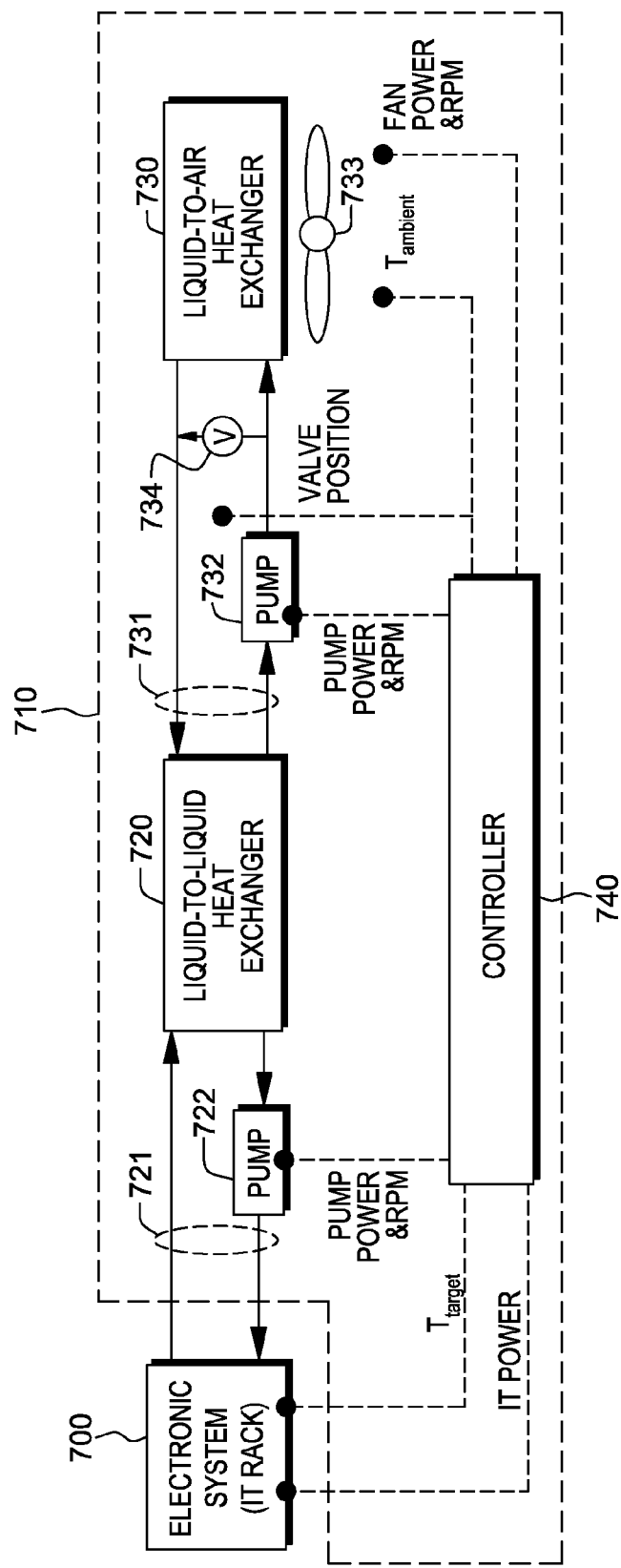
FIG. 7A is a schematic of another embodiment of a cooling system cooling one or more electronic systems of a data center, and controlled in accordance with one or more aspects of the present invention.
Figure 7B:
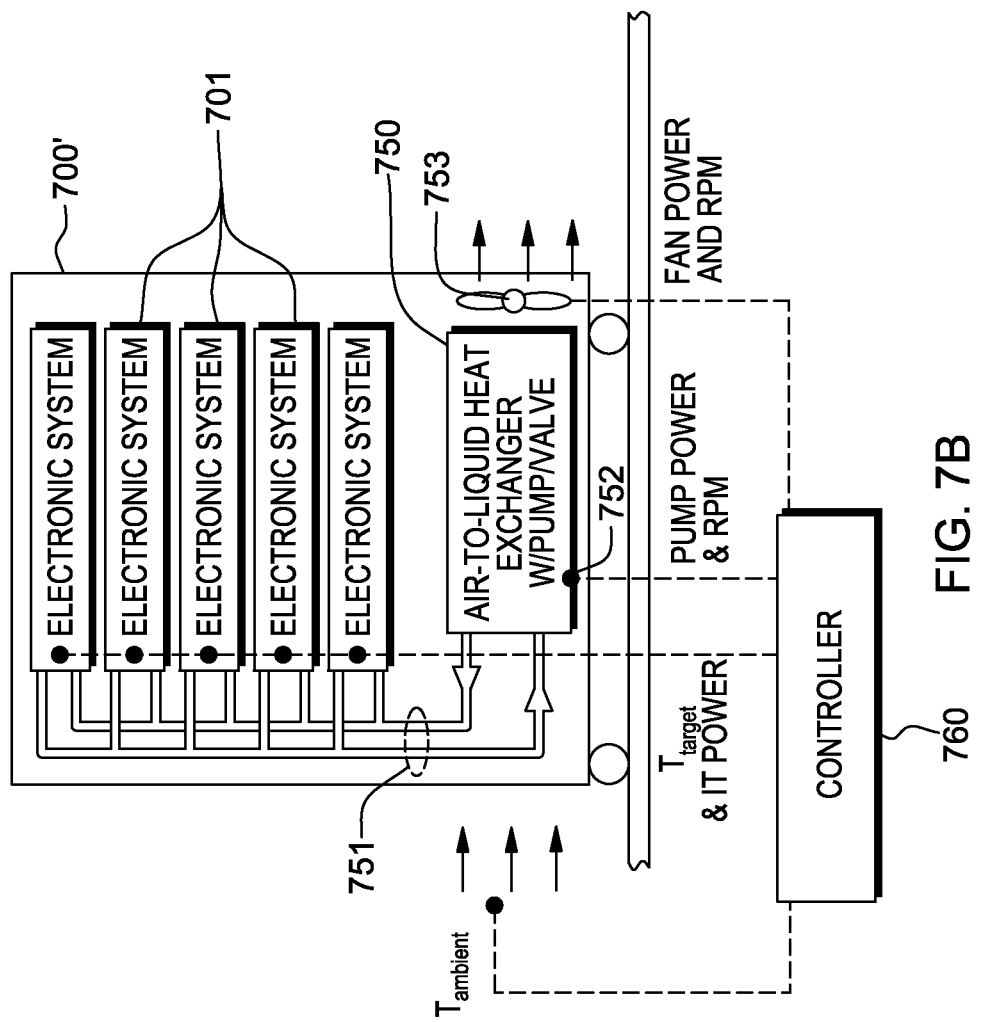
FIG. 7B is a schematic of a further embodiment of a cooling system cooling an electronic system, and controlled in accordance with one or more aspects of the present invention.
Figure 8:
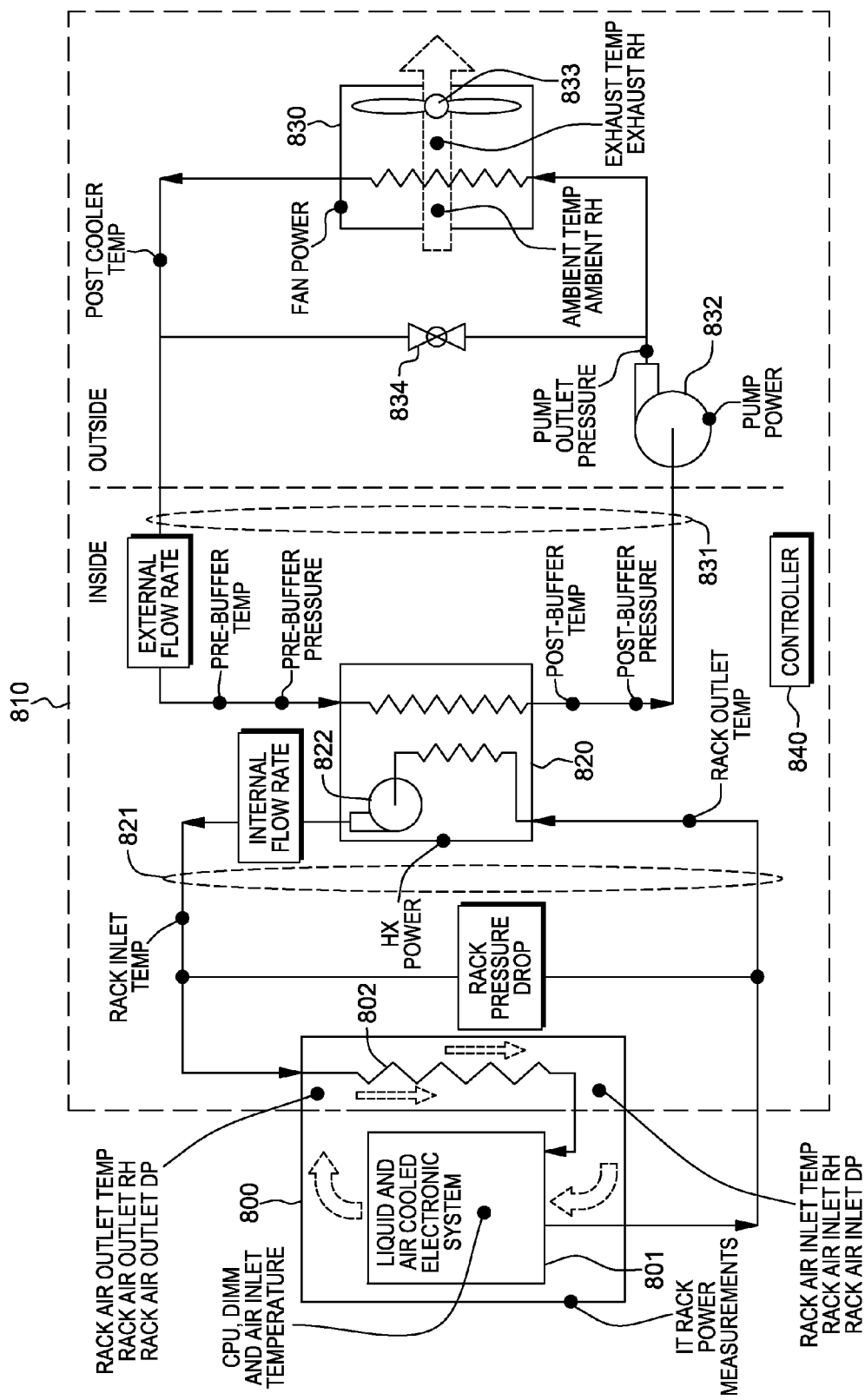
FIG. 8 is a more detailed schematic of one embodiment of a cooling system comprising controlled cooling of an electronic system with reduced energy consumption, in accordance with one or more aspects of the present invention.

FIGS. 7A, 7B & 8 depict various examples of a cooled electronic system comprising a controller (or control system) implementing reduced power consumption cooling control, in accordance with aspects of the present invention. Note that as used herein, a controller or control system may comprise, by way of example, a computer or a programmable logic controller. The control system may include, for instance, a processor (e.g., a central processing unit), a memory (e.g., main memory), and multiple input/output (I/O) connections, interfaces, devices, etc., coupled together via one or more buses and/or other connections. In one application, the controller or control system couples to a plurality of sensors, such as temperature, pressure, and position sensors, as well as to one or more actuators for controlling, for instance, coolant pump speed, fan speed, or position of one or more recirculation valves. Note that the input/output sense and control arrangements may be integrated within the controller or control system, or they may be external I/O modules or devices coupled to the controller which facilitate the desired sensing and actuation functions.

The cooled electronic system depicted in FIG. 7A includes an electronic system (or rack) 700 and a cooling system 710 providing, for example, liquid coolant via a first coolant loop 721 to electronic system (or rack) 700. Electronic system 700 may include, for example, one or more coolant-cooled structures and/or one or more air-to-coolant heat exchangers, such as described above in connection with FIGS. 2-6.

In the depicted embodiment, cooling system 710 includes a liquid-to-liquid heat exchanger 720 and a liquid-to-air heat exchanger 730. First coolant loop 721 couples in fluid communication with liquid-to-liquid heat exchanger 720, as does a second coolant loop 731 connecting liquid-to-liquid heat exchanger 720 to liquid-to-air heat exchanger 730. In this embodiment, a first coolant pump 722 pumps coolant through first coolant loop 721, and a second coolant pump 732 pumps coolant through second coolant loop 731. In addition, an air-moving device, such as a fan 733, facilitates air movement across liquid-to-air heat exchanger 730, and a recirculation valve 734 is provided, which may be a controllable valve with multiple valve settings between an open position and a closed position. A controller 740, such as a programmable logic controller or a computer, implements (in one embodiment) the control system processing described herein. Controller 740 is coupled to control, for instance, one or more of first coolant pump 722, second coolant pump 732, fan 733 and recirculation valve 734. In operation, controller 740 senses or receives the power and/or speed (or revolutions per minute (RPMs)) of first coolant pump 722, second coolant pump 732, and fan 733. Controller 740 further senses a targeted or control temperature ($T_{target}$) associated with, for example, the electronic system or electronics rack, as well as power consumed by the electronic system (e.g., IT power).

FIG. 7B depicts an alternate embodiment of a cooled electronic system which comprises an electronics rack 700' with multiple electronic systems (or subsystems) 701, such as the coolant-cooled electronic systems described above in connection with FIGS. 3-6. An air-to-liquid heat exchanger 750 provides cooled coolant via a coolant loop 751 to the electronic systems 701 within electronics rack 700'. A controller 760 provides energy efficient cooling control of the cooling system and electronic system and, in one embodiment, couples to a pump 752 of air-to-liquid heat exchange unit 750 to control a flow rate of coolant through coolant loop 751, as well as to an air-moving device, such as a fan 753 associated with the air-to-liquid heat exchange unit 750. In addition to sensing pump and fan power or speed (RPMs), controller 760 is coupled to sense a targeted temperature ($T_{target}$) at, for example, the coolant inputs to the individual electronic systems 701, as well as electronic system power being consumed (IT power), and the ambient airflow temperature ($T_{ambient}$).

Figure 7C:
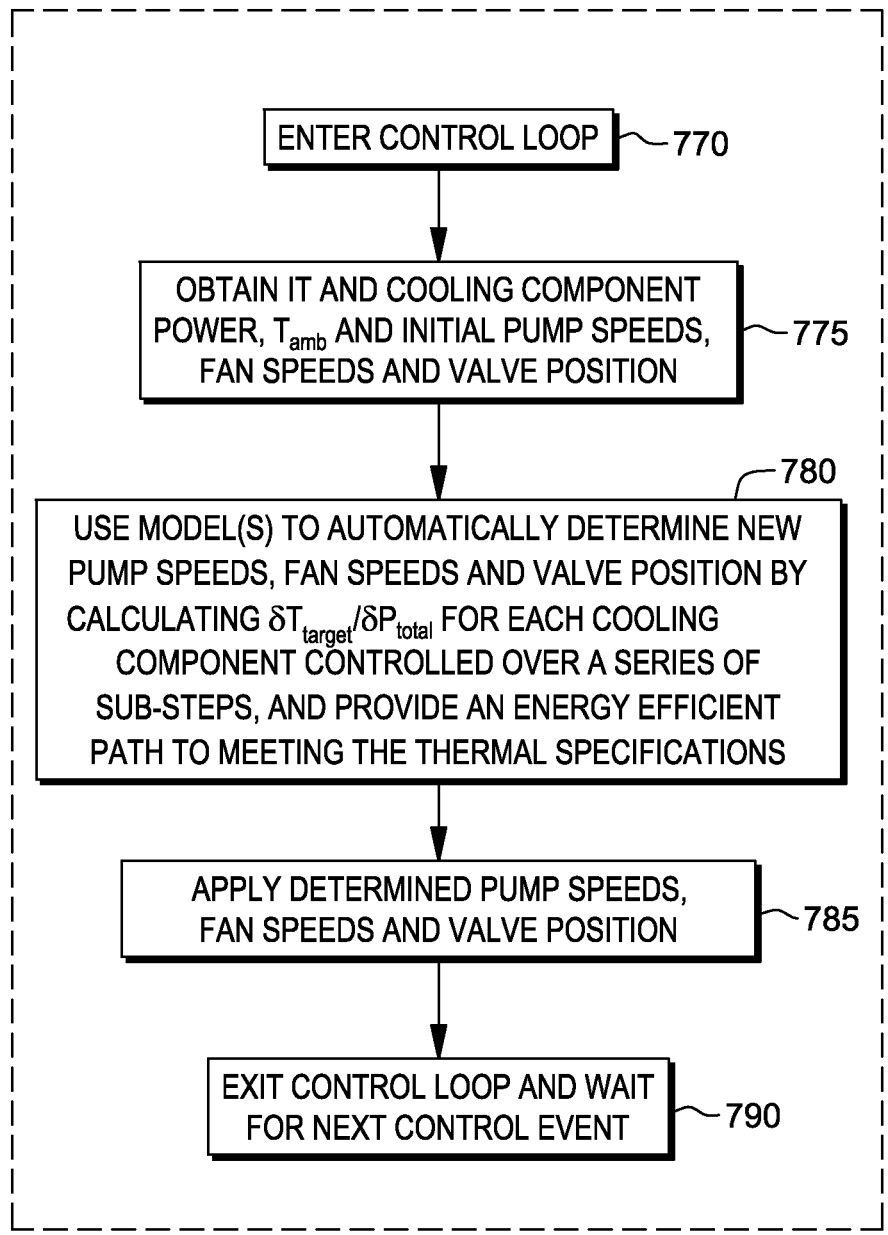
FIG. 7C depicts one embodiment of a process for energy efficient control of a cooling system cooling an electronic system, in accordance with one or more aspects of the present invention.

FIG. 7C depicts a high level overview of a control process, in accordance with one or more aspects of the present invention. By way of example, the control process may be automatically implemented by a control system, such as the controllers in the cooled electronic system embodiments of FIGS. 7A & 7B. Upon entering the control loop 770, power being consumed by the cooling system components and the electronic system is obtained, along with (in one example) the ambient temperature ($T_{amb}$), initial cooling pump speeds, fan speeds and any valve position 775. Note that pump speed(s) refer to the speed of one or more coolant pumps of the cooling system, fan speed refers to the speed of one or more fans associated with the cooling system, and the valve position refers to the position of one or more valves, such as recirculation valves, within the cooling system.

Previously determined models may then used to determine new or adjusted control settings (or states) for the cooling system, including (by way of example) the coolant pump speed(s), fan speed(s) and valve positions by calculating partial derivatives ($\delta T_{target}/\delta P_{total}$) (in one embodiment) for each adjustable cooling component of the cooling system over a series of incremental steps and evaluations 780. This modeling and partial derivatives approach can provide an energy efficient path to meeting desired thermal specifications, as discussed further below. The new control settings are then applied to one or more of the coolant pumps, fans or valve of the cooling system 785, after which the control system exits the control loop and waits for a next control initiation event 790.

FIG. 8 depicts a more detailed example of a cooling system and cooled electronic system to undergo control, in accordance with one or more aspects of the present invention. In this embodiment, an air-tight electronics rack (or rack enclosure) 800 includes one or more cooled electronic systems 801 and an air-to-coolant heat exchanger 802, for example, in a configuration similar to that described above in connection with FIGS. 4-6. A cooling system 810 provides cooling to the electronics rack and includes a liquid-to-liquid heat exchanger 820 and a liquid-to-air dry cooler 830. A first coolant loop 821 couples liquid-to-liquid heat exchanger 820 to the cooling structures of electronics rack 800, and a second coolant loop 831 couples liquid-to-liquid heat exchanger 820 to liquid-to-air dry cooler 830, which in the embodiment shown, is located outside of a data center, with airflow across the liquid-to-air dry cooler 830 being an outdoor ambient airflow assisted by an air-moving device or fan 833. A first coolant pump 822 facilitates circulation of coolant through first coolant loop 821, and a second coolant pump 832 facilitates circulation of coolant through second coolant loop 831. An adjustable recirculation valve 834 is provided in parallel with liquid-to-air dry cooler 830 to facilitate, for example, control of coolant temperature within second coolant loop 831. In this example, first coolant loop 821 is an internal coolant loop, and second coolant loop 831 is an external coolant loop.

A controller 840 is provided coupled to one or more adjustable cooling components of cooling system 810, such as first coolant pump 822, second coolant pump 832, fan 833 and recirculation valve 834. In addition, controller 840 may be coupled to sense or obtain a variety of temperature, power and pressure states, including, for example, electronic system power measurements, electronic component temperatures and airflow temperatures across electronic components, airflow relative humidity and dew point temperature, for example, at the inlet and outlet of air-to-coolant heat exchanger 802, pressure drop across the electronic system (or electronics rack), coolant inlet temperature to an electronic system (or rack), coolant outlet temperature, heat exchanger pump power being consumed, temperature and pressure of coolant within the second coolant loop before and after the liquid-to-liquid heat exchanger 820 or buffer, coolant pressure within the second coolant loop, ambient airflow temperature and relative humidity, air exhaust temperature from the liquid-to-air dry cooler, power consumed by and speeds of the coolant pumps and fans, post dry cooler coolant temperature within the second coolant loop, etc. Additionally, controller 840 is configured with control processing to reduce, or optimize, power consumption of the cooling system while providing a desired targeted temperature, such as liquid coolant temperature ($T_{liq}$), to the cooled electronic system.

A variety of control process embodiments may be implemented by the control system, depending for example, on the target or control temperature selected, and whether cooling system power is considered alone or whether total power consumed is considered, including the cooling system power and electronic system power loads. For example, control of coolant inlet temperature ($T_{liq}$) to an electronics rack may be desired while minimizing cooling system power ($P_c$) consumption employing a single adjustable cooling component of the cooling system. In the example of FIG. 8, the cooling system power consumption can be determined by monitoring power load of the liquid-to-liquid heat exchanger pump ($P_{buffer}$), power consumed by the second coolant pump ($P_{pump}$), and power consumed by the fan(s) of the liquid-to-air dry cooler ($P_{fan(s)}$). This embodiment represents a simplest control algorithm to implement, since only one adjustable cooling component needs to be modeled and controlled. The electronic system details are not included or calculated in this analysis. To implement, a customer simply specifies a required inlet coolant temperature range. Although simplest to implement, this approach may not provide the most energy efficient solution, since only one adjustable cooling component is being controlled, and only cooling system power is being considered.

In another embodiment, the control system controls cooling and energy consumption, again for a targeted temperature variable, such as coolant inlet temperature to the electronic system or rack, while minimizing coolant system power consumption using multiple adjustable cooling components of the cooling system. In this approach, partial derivatives $(\delta T_{liq}/\delta P_c)_i$ are determined for each adjustable cooling component (i) of the multiple adjustable cooling components of the cooling system. Note that $T_{liq}$ is the targeted temperature in this example, and $P_c$ is the power consumption of the cooling system. As discussed further below, the partial derivatives may be analytically or numerically determined by one skilled in the art. These derivatives advantageously facilitate determining a best adjustable cooling component to engage at a particular sub-step of the control process. The partial derivative(s) employed herein may be, for instance, the rate of change of the targeted temperature due to a rate of change of power to the particular adjustable coolant component for which the partial derivative is being calculated. The control system essentially determines what happens to the targeted temperature when power is changed to a particular cooling component of the cooling system, while keeping any other cooling components constant.

In a further embodiment, control may be provided with reference to a targeted temperature variable (such as the coolant inlet temperature to the electronic system), while minimizing total power consumed ($P_t$) by the electronic system and the cooling system using multiple adjustable cooling components of the cooling system. The total power ($P_t$) consumed equals the power consumed by the electronic system ($P_{IT}$), as well as the power consumed by the cooling system ($P_c$). Partial derivatives $(\delta T_t/\delta P_t)_i$ may be determined, either analytically or numerically, as discussed herein. Note that a numerical determination may be employed where an analytical determination results in equations too complex to be readily solved. Since control is provided (in this embodiment) to the total power usage of the cooled electronic system, a more energy efficient solution may be obtained using this approach.

In still another embodiment, control may be provided with reference to, for example, a targeted temperature variable which comprises a temperature associated with an electronic component, such as a processor of the electronic system, or a dual-in-line memory module (DIMM) or array of the electronic system, or (for example) to air temperature across the electronic system, such as a rack inlet air temperature, while minimizing total power ($P_t$) using, for example, multiple adjustable cooling components of the cooling system providing coolant to the electronic system. Note that in this embodiment, the models employed may be more complex, potentially utilizing derived knowledge of component temperatures as a function of air and liquid temperatures, workloads and flow rates. However, this approach might provide the finest level of temperature control with potentially optimal energy use reduction/control. The external control platform or system may tie into the electronic system diagnostics if instrumentation is unavailable to provide the temperature and power values desired.

To facilitate the following further explanation, the below-listed variables are defined:

$S_i$=representative speed in RPMs of an adjustable cooling component i;
$T_{amb}$=outside ambient temperature;
$T_{room}$=computer room temperature;
$T_{dp}$=rack dew point temperature;
$T_{liq}$=rack inlet coolant temperature;
$T_t$=temperature at the targeted point t, where t represents (for example) electronic component temperature, air temperature across the electronic system, or a coolant temperature at point t;
$T_{t,spec}$=user specified desired temperature at monitoring point t;
$T_{t,crit}$=user specified critical temperature at monitoring point t;
$\epsilon_1$ and $\epsilon_4$=temperature tolerances (can be=0); and
$\epsilon_2$ and $\epsilon_3$=derivative tolerances (can be=0).

By way of specific example, the targeted temperature ($T_t$) can be modeled as follows:

$$T_t = f(S_1, S_2, \ldots, S_m, P_{IT}) = T_{amb} + (\Sigma_{z=1 \to w}(A_{z,0} \times (S_1)^{Az,1} \times (S_2)^{Az,2} \times \ldots \times (S_m)^{Az,m})) \times P_{IT}$$

where:
z=heat exchange step
w=total number of steps between $T_t$ and $T_{amb}$
m=total number of adjustable cooling components
A=constants For example, in FIG. 8, there are two heat exchange steps (w=2) between rack inlet temperature ($T_{liq}$) and ambient temperature ($T_{amb}$) with three pieces of cooling components (m=3). Note that the value of constants A, as well as constants B and C discussed below, in the models for $T_t$ and $P_y$ ($P_t$ or $P_c$) may be determined empirically. In particular, systematic experiments may be carried out by one skilled in the art to measure the $T_t$ and $P_y$ with the speed of one of the cooling components of the cooling system being varied, while the others are maintained constant. This process is repeated until the impact on $T_t$ and $P_y$ for a change in operating condition for each component of the cooling system is determined. This data is then numerically fitted to a base model, which may be obtained by one skilled in the art from theory or numerical simulations, to determine the value of the constants.

By way of further example, with $T_t = T_{liq}$, and with two heat exchange steps and three pieces of cooling equipment, as shown in FIG. 8:

$$T_t = T_{amb} + P_{IT}[(76.0 \times S_{buffer}^{0.334} \times S_{pump}^{-1.071} \times S_{fan}^{0}) + (13.4 \times S_{buffer}^{0} \times S_{pump}^{0.378} \times S_{fan}^{-1.225})]$$

For more specific calculations: $P_{IT} = 12.3 + 0.037 \times T_{liq}$, may be employed with temperature $T_{liq}$ being solved iteratively.

The power consumed ($P_y$) may be modeled as set forth below. Note that $P_y$=power consumed, and $P_y$ is either i) cooling equipment power ($P_c$) or ii) total power ($P_t$) (i.e., IT power ($P_{IT}$) plus cooling equipment power ($P_c$)).

Using the above-noted example of FIG. 8, the cooling power consumed may be expressed as:

$$P_c = f(S_1, S_2, \ldots, S_m) = \Sigma_{i=1 \to m}(B_{i,0} + B_{i,1} \times S_i + B_{i,2} \times S_i^2 + B_{i,3} \times S_i^3)$$

where:
- i=the $i^{th}$ cooling equipment;
- m=total number of cooling components in the cooling system; and
- B=constants.

By way of example, in FIG. 8, there are three pieces of cooling components (m=3). In addition, the total power consumed ($P_t$) may be expressed as:

$$P_t = P_c + P_{IT} = P_c + C_0 + C_1 \times T_{liq}$$

By way of further example, with two heat exchange steps and three pieces of cooling components (as shown in FIG. 8), the cooling power consumed ($P_c$) and the total power consumed ($P_t$) may be modeled as:

$$\begin{aligned}P_c &= P_{pump} + P_{buffer} + P_{fans} \\ &= (4.15E-05 \times S_{pump} + 2.62E-08 \times S_{pump}^2 + 4.80E-12 \times S_{pump}^3) + \\ &\quad (4.15E-05 \times S_{buff} - 1.02E-08 \times S_{buff}^2 + 5.48E-12 \times S_{buff}^3) + \\ &\quad (1.85E-02 + 1.75E-04 \times S_{fans} - 5.49E-07 \times S_{fans}^2 + \\ &\quad 2.04E*-09 \times S_{fans}^3)\end{aligned}$$

$$P_t = P_c + 12.3 + 0.037 \times T_{liq}$$

As noted, the models employed may utilize partial derivatives for the targeted temperature variable and the cooling power or total power consumed given a fractional change in speed of a cooling component i. For example, a partial derivative $(\delta T_{liq}/\delta P_c)_{pump}$ represents the ratio of the fractional change in the coolant inlet temperature ($T_{liq}$) with the cooling equipment power ($P_c$) for a fractional change in the pump operating speed ($S_{pump}$). The partial derivatives $(\delta T_t/\delta P_y)_i$ can be determined by one skilled in the art either analytically or numerically:

Analytical: $(\delta T_t/\delta P_y)_i = (\delta T_t/\delta S_i)/(\delta P_y/\delta S_i)$ where $S_i$ is the speed of cooling component i. $(\delta T_t/\delta S_i)$ and $(\delta P_y/\delta S_i)$ are derived using partial differentiation from the models of $T_t$ and $P_y$ obtained from previous experimental characterizations of the various pieces of cooling components and may have the form shown above. This method can be used to directly determine the gradient once the initial analytical derivation is complete. However, depending on expression complexity, analytical differentiation may be difficult, thus requiring the gradient to be numerically determined.

Numerical: To numerically obtain the gradient $(\delta T_t/\delta P_y)_i$ for a piece of cooling equipment i, the change in temperature $\delta T_t$ can first be calculated from the previously determined models for a small change in rpm (e.g., 1 RPM) for cooling equipment i. Then the change in either total power or cooling power $\delta P_y$ can be calculated for the same change in RPM(s) for the same cooling equipment i. Having $\delta T_t$ and $\delta P_y$ the gradient $(\delta T_t/\delta P_y)_i$ can be determined. Note that this method does not require analytical differentiation, but at the cost of additional computation steps.

Figure 9:
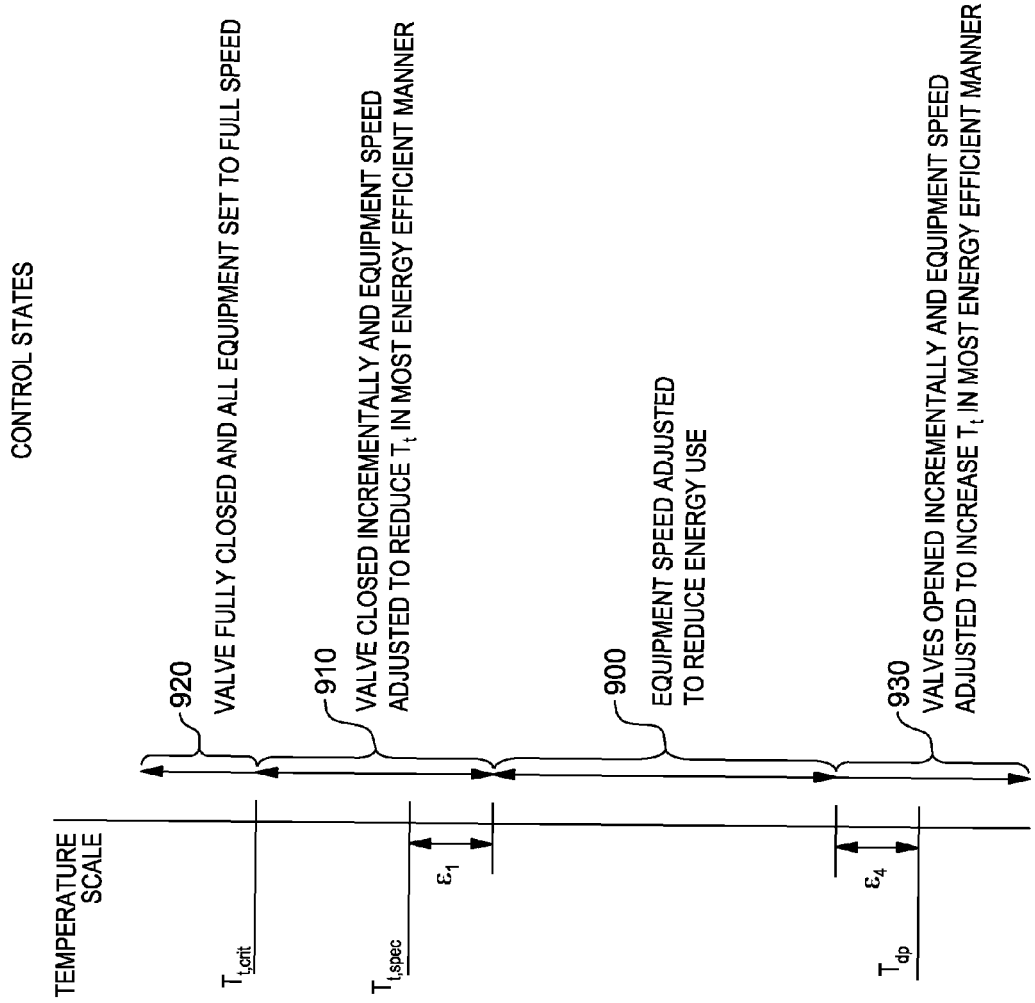
FIG. 9 depicts multiple possible control states of a cooling system cooling an electronic system, wherein the control states are indexed via one or more targeted temperatures associated with the cooling system and/or the electronic system, in accordance with one or more aspects of the present invention.

FIG. 9 depicts various control states of a control process, in accordance with one or more aspects of the present invention. By way of example, the control process of FIGS. 10A-10F is based on the different control states of FIG. 9.

Referring to FIG. 9, a first control state 900 is defined between a specified target temperature ($T_{t,spec}$) and a dew point temperature ($T_{dp}$) associated with the cooling system or electronic system. If desired, temperature tolerances $\epsilon_1$ and $\epsilon_4$ may be provided below the specified temperature ($T_{t,spec}$) and above the dew point temperature ($T_{dp}$), respectively, as illustrated. Within this first control state 900, the cooling system components may be adjusted to reduce (and/or minimize) energy use by the cooling system. For example, cooling equipment speeds may be adjusted to reduce energy use of the cooling system within this range.

In a second control state 910, defined between the specified control temperature ($T_{t,spec}$) and a critical temperature ($T_{t,crit}$), valves of the cooling system may be closed incrementally, and cooling system components may have speeds adjusted to reduce the targeted temperature ($T_t$) in a most energy efficient manner, such as described below. In a third control state 920, the control temperature is above the critical target temperature. In this state, the control system automatically closes any recirculation valves, and the adjustable control components are set to full speed within the cooling system to attempt to bring the targeted temperature below the critical temperature. In a fourth control state 930, the target temperature is below the dew point temperature ($T_{dp}$), or below the dew point temperature plus a temperature tolerance $\epsilon_4$. In this control state, any recirculation valves are opened incrementally, and the speeds of the adjustable cooling components, such as pumps and fans, are adjusted to increase the targeted temperature ($T_t$) in a most energy efficient manner, such as described below.

As noted, FIGS. 10A-10F depict one embodiment of a control process for automatically operating a cooling system in a manner which provides the needed cooling and reduces power consumption of the cooling system. The control process starts 1000 in FIG. 10A by setting the speed(s) of the controlled coolant component(s) to maximum, and closing any recirculation valve(s) 1002. The control system inquires whether the cooled electronic system is to be switched off 1004, and if "yes", determines whether the electronic system power load is below a minimum acceptable power load 1012. If "yes", then the control system waits a time interval $t_2$ to allow the system to cool down further 1014, before switching off the cooling components 1016 of the cooling system.

Assuming that the cooling system is not to be switched off 1004, or if so, that the current electronic system power dissipation is greater than the minimum acceptable power dissipation for switching the system off 1012, then processing determines an adjusted set of control settings for the cooling equipment's speed and valve positions based on current sensor inputs and the characterized system functions 1006. One embodiment of this process is depicted in FIGS. 10B-10F, and described below. After determining the new set of adjusted control settings, processing applies the settings, including coolant component speed(s) and valve position(s) 1008, before waiting a time interval $t_1$ 1010, and returning to determine whether the cooled electronic system is to be switched off 1004.

Figure 10A:
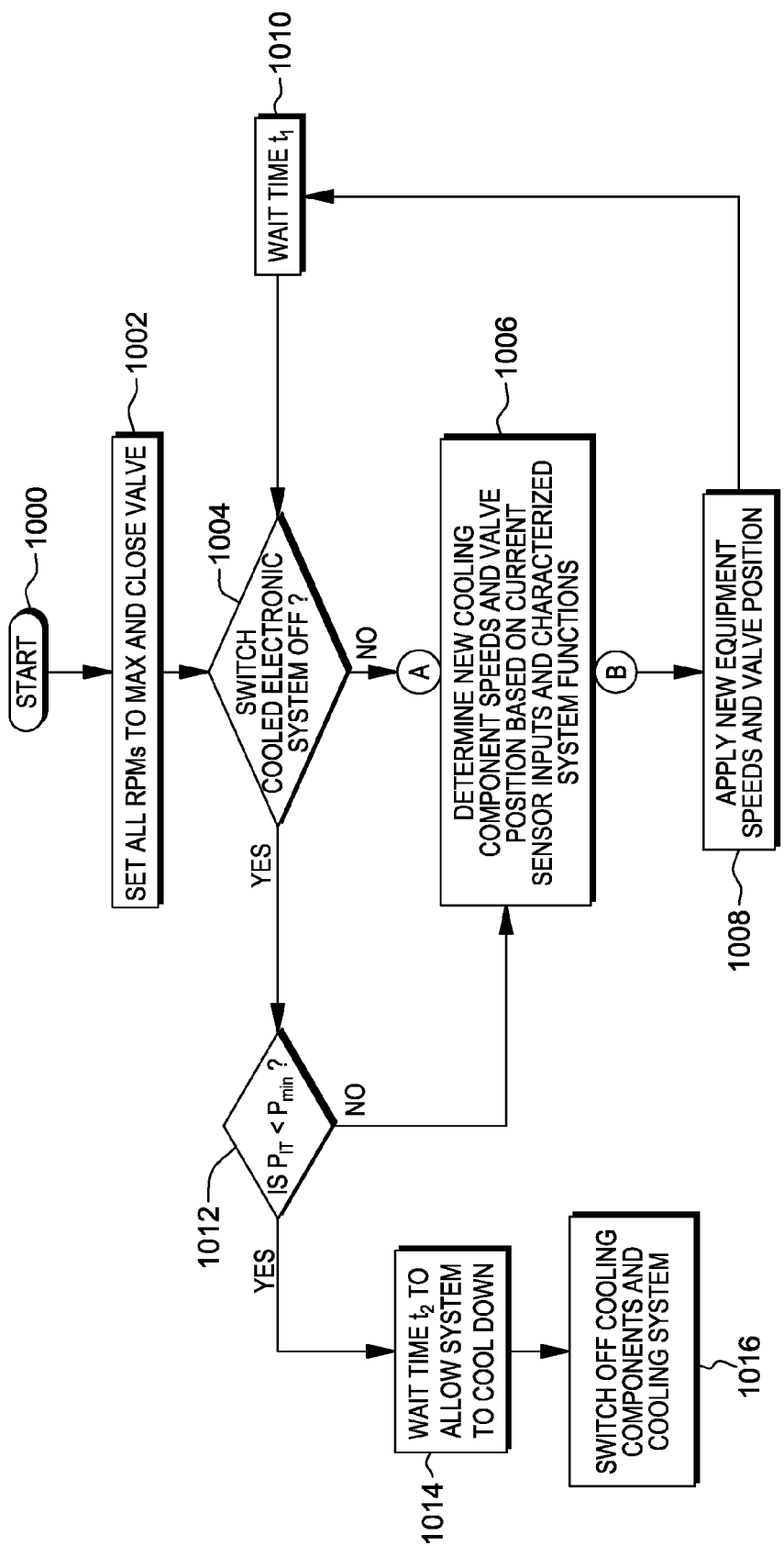
Figure 10B:
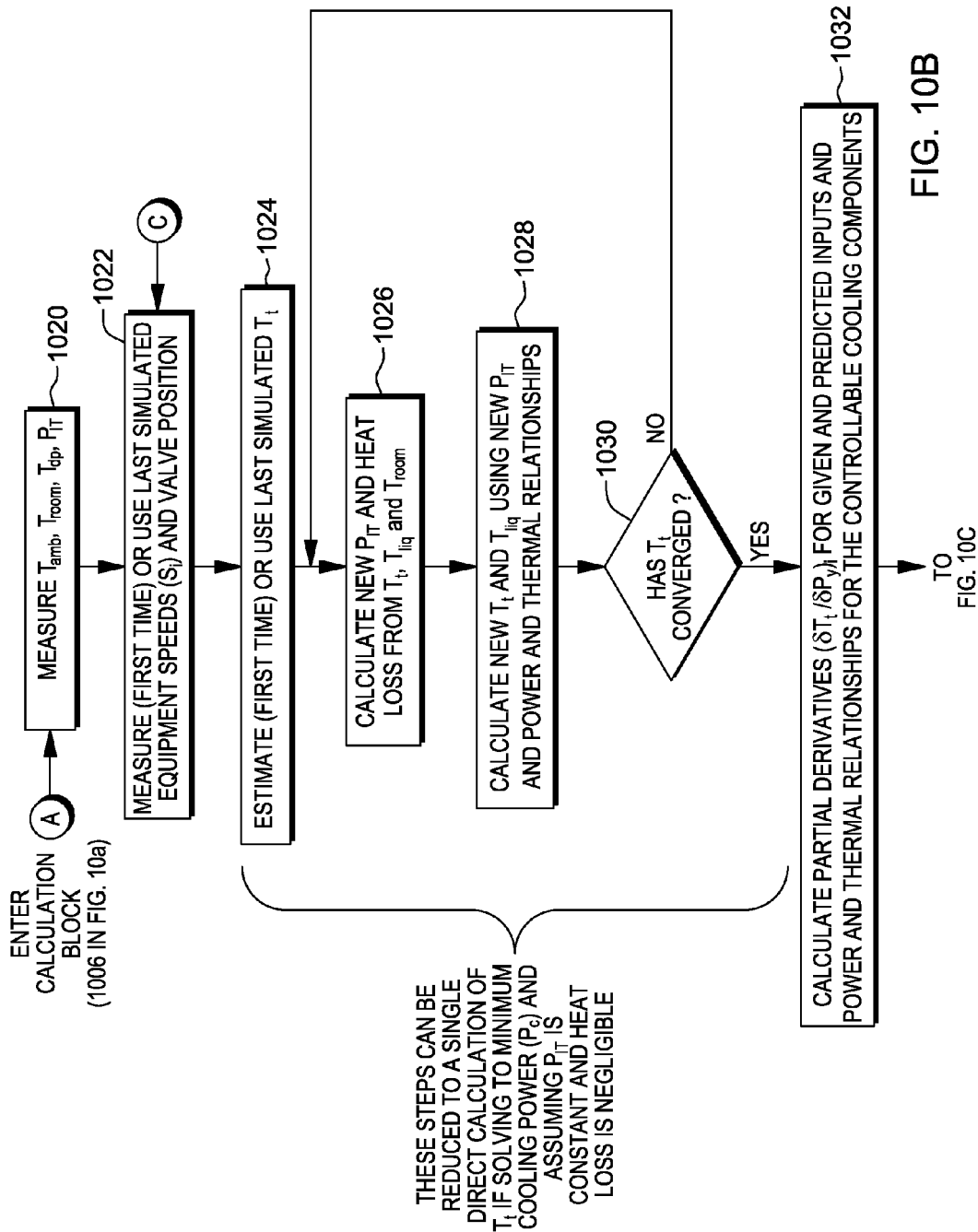

Assuming that one or more adjusted component settings are to be determined, then from FIG. 10A, the control process continues in FIG. 10B with measuring or obtaining (in one embodiment) the ambient temperature ($T_{ambient}$), the data center room temperature ($T_{room}$), the dew point temperature ($T_{dp}$), and the power consumed by the electronic (or IT) system or rack ($P_{IT}$) 1020. The first time through this control loop, speeds of coolant components ($S_i$) may be measured and valve position(s) sensed 1022. After the first time through, the last simulated speed or valve position may be employed. Next, the targeted temperature, which in one example, may be the coolant inlet temperature to the electronic system ($T_{liq}$) is estimated (if the first time through the control process), or the last simulated temperature $T_{liq}$ is employed 1024. The new electronic system power ($P_{IT}$) and heat loss are determined from the target temperature (e.g., $T_{liq}$ and $T_{room}$) 1026, as well as a new target temperature using the new electronic system power consumed ($P_{IT}$) and the thermal and power relationships or models described above 1028. Control processing then determines whether the target temperature ($T_t$) has converged, that is, whether the target temperature has stopped changing 1030. If "no", then processing calculates a new electronic system power and heat load from the target temperature (liquid temperature and room temperature) 1026. Note that, if desired, process steps 1024-1030 may be reduced to a single direct calculation of $T_t$ if solving to cooling system power consumption ($P_c$), and assuming that the electronic system power ($P_{IT}$) is constant and heat loss is negligible.

Assuming that the control temperature ($T_t$) has converged, then processing determines (in one embodiment) partial derivatives $(\delta T_t/\delta P_y)_i$ for the given inputs and the power and thermal relationships, for all controllable cooling components of the cooling system 1032.

Figure 10C:
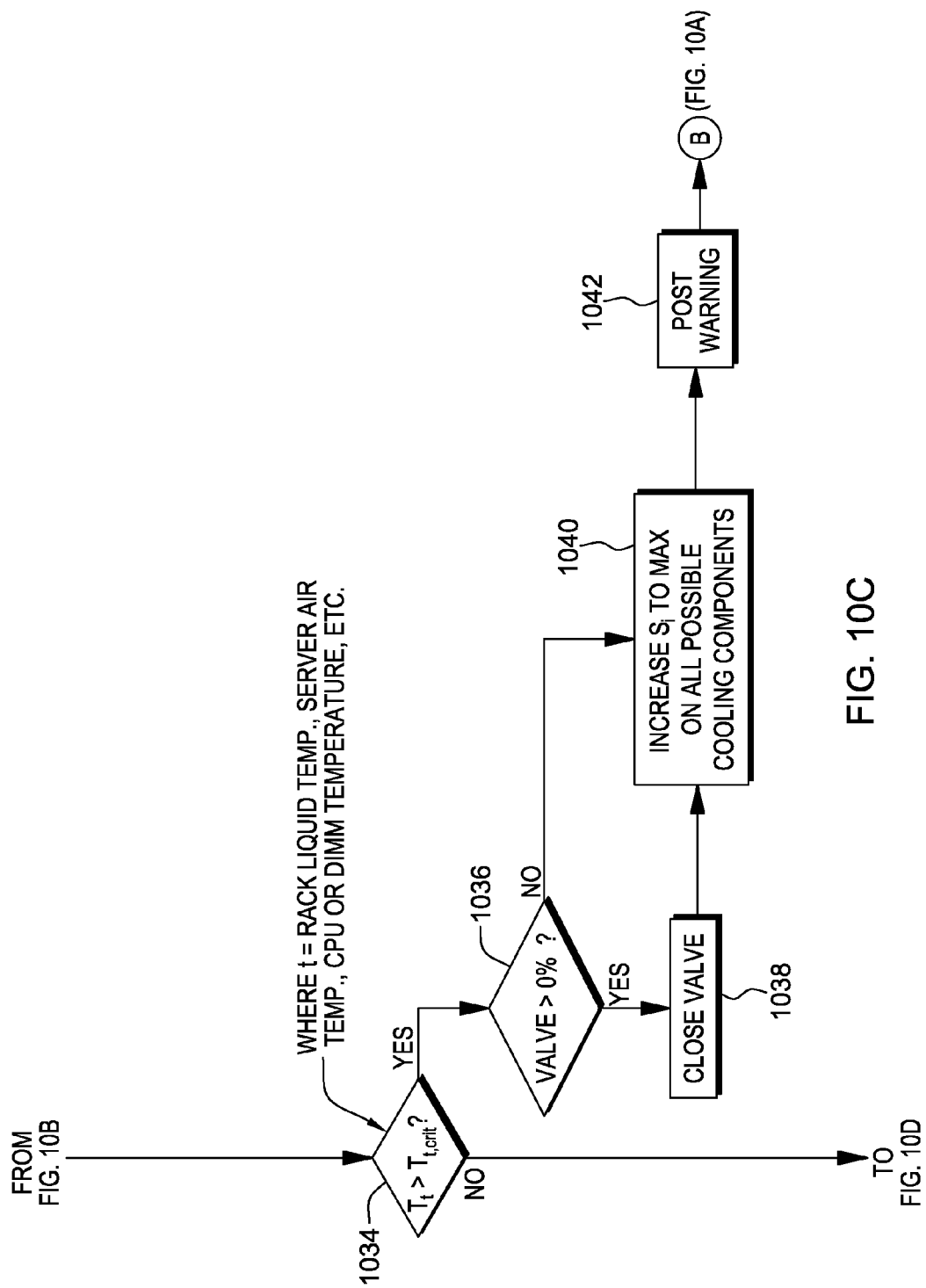

Continuing with FIG. 10C, processing next determines whether the target temperature ($T_t$) is above the critical temperature ($T_{t,critical}$) 1034. If "yes", then the control system determines whether any recirculation valves are open 1036. If "yes" again, then the recirculation valve(s) is closed 1038. Thereafter, processing increases the speed of any controlled pumps or fans within the cooling system to maximum 1040, and posts a warning 1042 that the targeted temperature is above the critical temperature, after which processing returns to the process of FIG. 10A to apply the adjusted component speeds and valve positions.

Figure 10D:
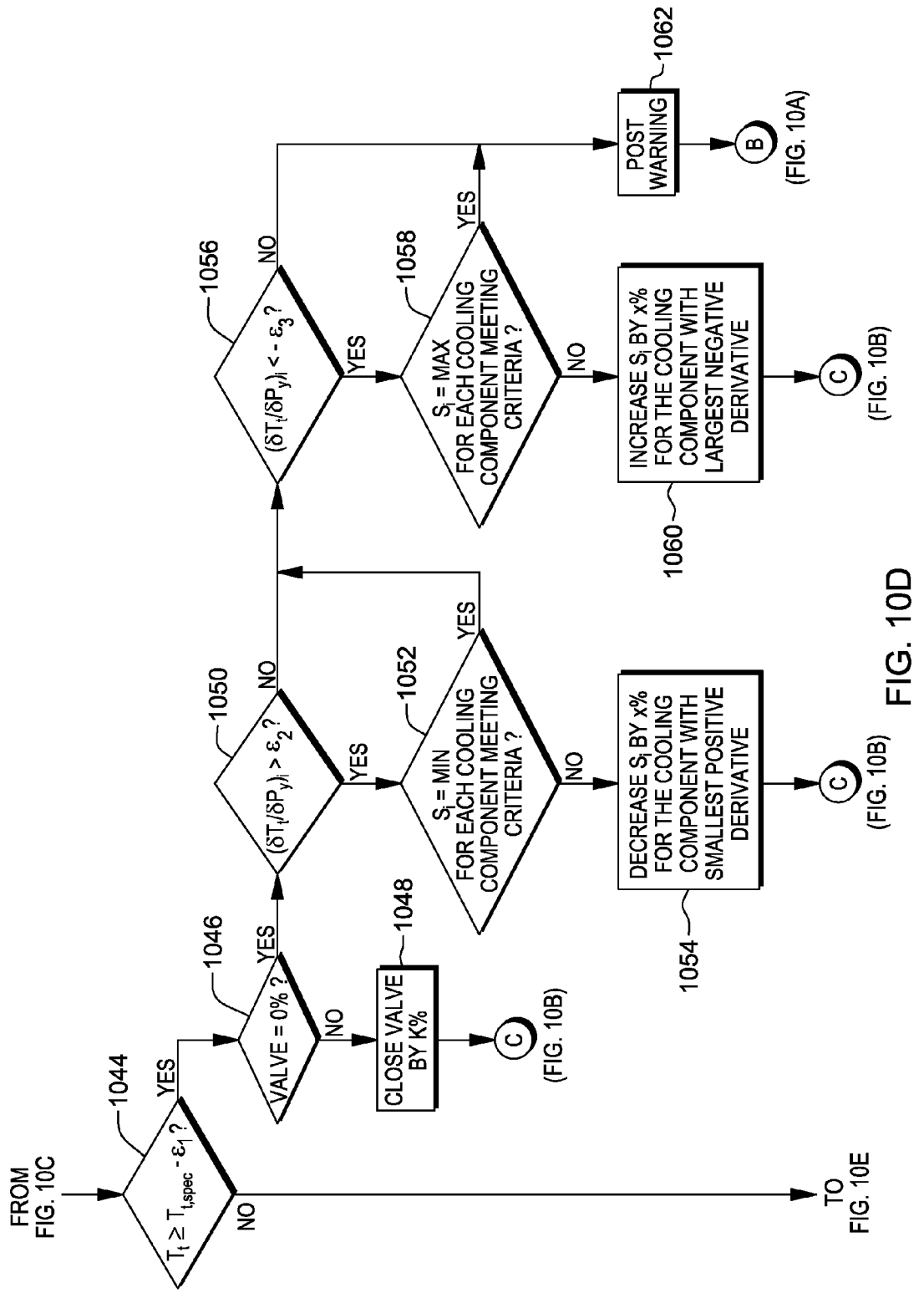

As shown in FIG. 10D, assuming that the targeted temperature is below the critical target temperature, then processing determines whether the targeted temperature is greater than or equal to the specified targeted temperature minus a first temperature tolerance $\epsilon_1$ 1044, wherein tolerance $\epsilon_1$ may be zero, or a small number, depending on whether a tolerance is desired. This inquiry determines whether the control state is in the second control state between the specified target temperature and the critical target temperature. If "yes", then processing determines whether any adjustable recirculation valve(s) is closed 1046, and if "no", closes the recirculation valve(s) by k % 1048, before returning to the process flow of FIG. 10B to continue with the automatic determination of optimal control settings for the cooling equipment.

Continuing with FIG. 10D, assuming that the adjustable valve(s) is closed, then processing determines for each controllable cooling equipment (that is, other than the valves), whether the associated partial derivative $(\delta T_t/\delta P_y)_i$ is greater than a derivative tolerance $\epsilon_2$ 1050. If "yes", then processing determines whether the speed ($S_i$) for each such controllable cooling component, is set to a minimum, that is, of each controllable component meeting the criteria 1052. If "no", then speed is decreased by x % for the cooling component with the largest positive derivative 1054, after which processing continues with the simulation processing of FIG. 10B.

Assuming that the partial derivative of each cooling component does not exceed the derivative tolerance, or if so, that the speed of each component having a derivative exceeding the tolerance is set to a minimum, then processing determines whether the partial derivative is already less than a negative tolerance $\epsilon_3$. If "yes", then processing determines whether the speed of each cooling component having a partial derivative less than $-\epsilon_3$ is set to a maximum 1058, and if so, a warning is posted 1062 and processing returns to the process of FIG. 10A to apply the adjusted equipment settings. Note also that if the partial derivatives are not less than $-\epsilon_3$, then the warning is posted, and processing returns to the control process of FIG. 10A.

Assuming that the speed of each cooling component meeting the partial derivative criteria of 1056 is not set to maximum, then processing increases the speed by x % of the cooling component with the largest negative derivative 1060, before continuing with the simulation of FIG. 10B.

Figure 10E:
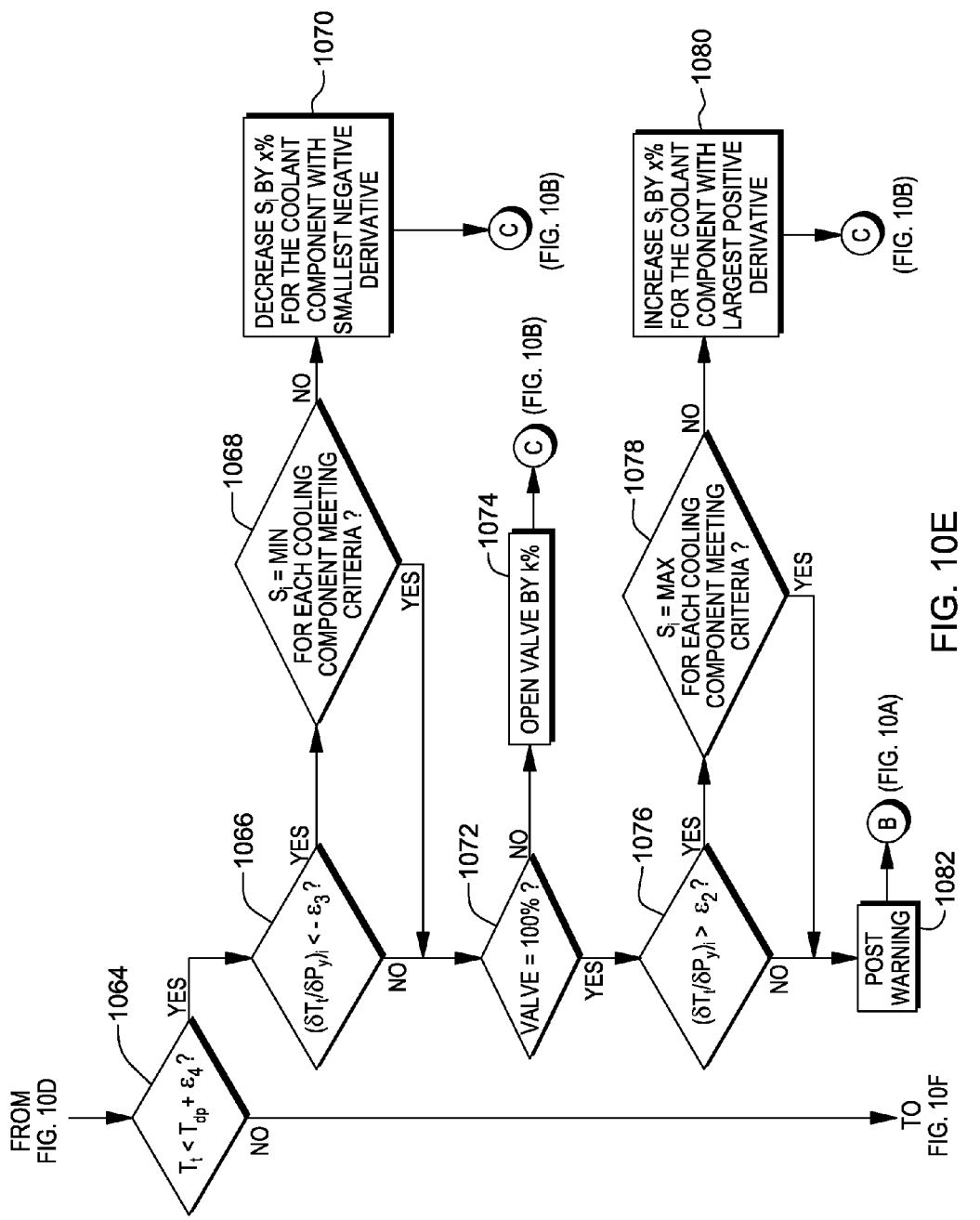

Referring to FIG. 10E, assuming that the control temperature ($T_t$) is less than the specified control temperature ($T_{t,spec}$)$-\epsilon_1$, then processing determines whether the control temperature ($T_t$) is less than the dew point temperature ($T_{dp}$)$+\epsilon_4$ 1064. If "yes", then the partial derivative for each adjustable cooling component is determined $(\delta T_t/\delta P_y)_i$ and processing ascertains whether each partial derivative is less than $-\epsilon_3$ 1066. If "yes", then processing inquires whether the speed of each cooling component meeting the criteria is already set to a minimum 1068, and if "no", the speed ($S_i$) is decreased by x % for the cooling component with the smallest negative derivative 1070, after which processing continues with the simulation of FIG. 10B.

Assuming that the partial derivatives are larger than or equal to $-\epsilon_3$, or that the speed of each component having a partial derivative meeting the criteria is at a minimum, then processing determines whether the recirculation valve(s) is full open 1072, and if "no", opens the valve by k % 1074, before continuing with the simulation processing of FIG. 10B.

If each valve is full open, processing determines whether the partial derivative $(\delta T_t/\delta P_y)_i$ is greater than $\epsilon_2$ 1076, and if "yes" determines whether, for any component meeting the criteria, its speed is set to a maximum 1078. If "no", then the speed ($S_i$) of the component with the largest positive derivative is increased by x % 1080, after which processing continues with the simulation of FIG. 10B. If the partial derivatives are less than or equal to the derivative tolerance $\epsilon_2$, or if the speed of any component having a partial derivative greater than $\epsilon_2$ is already at a maximum, then a warning is posted 1082, and processing returns to the control flow of FIG. 10A.

Assuming that the targeted temperature ($T_t$) is in the first control state 900 (FIG. 9), then as shown in FIG. 10F, processing determines whether the partial derivatives for the cooling components of the cooling system are each greater than tolerance $\epsilon_2$ 1084, and if "yes", determines whether the speed of each cooling component meeting the criteria is at a minimum 1086. If "no", speed is decreased by x % for the cooling component with the smallest positive derivative 1088, and processing returns to the simulation of FIG. 10B. If the partial derivative of each cooling component is not greater than $\epsilon_2$, or if the speed of each cooling component having a partial derivative meeting the criteria is set to a minimum, then processing determines whether each partial derivative is less than a negative $\epsilon_3$ tolerance 1090. If "yes", processing determines whether the speed of each cooling component having a partial derivative meeting the criteria is set to a minimum 1092, and if "no", decreases speed ($S_i$) by x % for the cooling component with the smallest negative derivative 1094, before returning to the simulation processing of FIG. 10B, where indicated.

Assuming that each partial derivative is not less than negative $\epsilon_3$ tolerance, or if so, it is already set to a minimum, processing returns to the control flow of FIG. 10A to apply any adjusted control settings.

As will be appreciated by one skilled in the art, one or more aspects of the present invention may be embodied as a system, method or computer program product. Accordingly, one or more aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system". Furthermore, one or more aspects of the present invention may take the form of a computer program product embodied in one or more computer readable medium(s) having computer readable program code embodied thereon.

Any combination of one or more computer readable medium(s) may be utilized. The computer readable medium may be a computer readable storage medium. A computer readable storage medium may be, for example, but not limited to, an electronic, magnetic, optical, electromagnetic, or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

Figure 11:
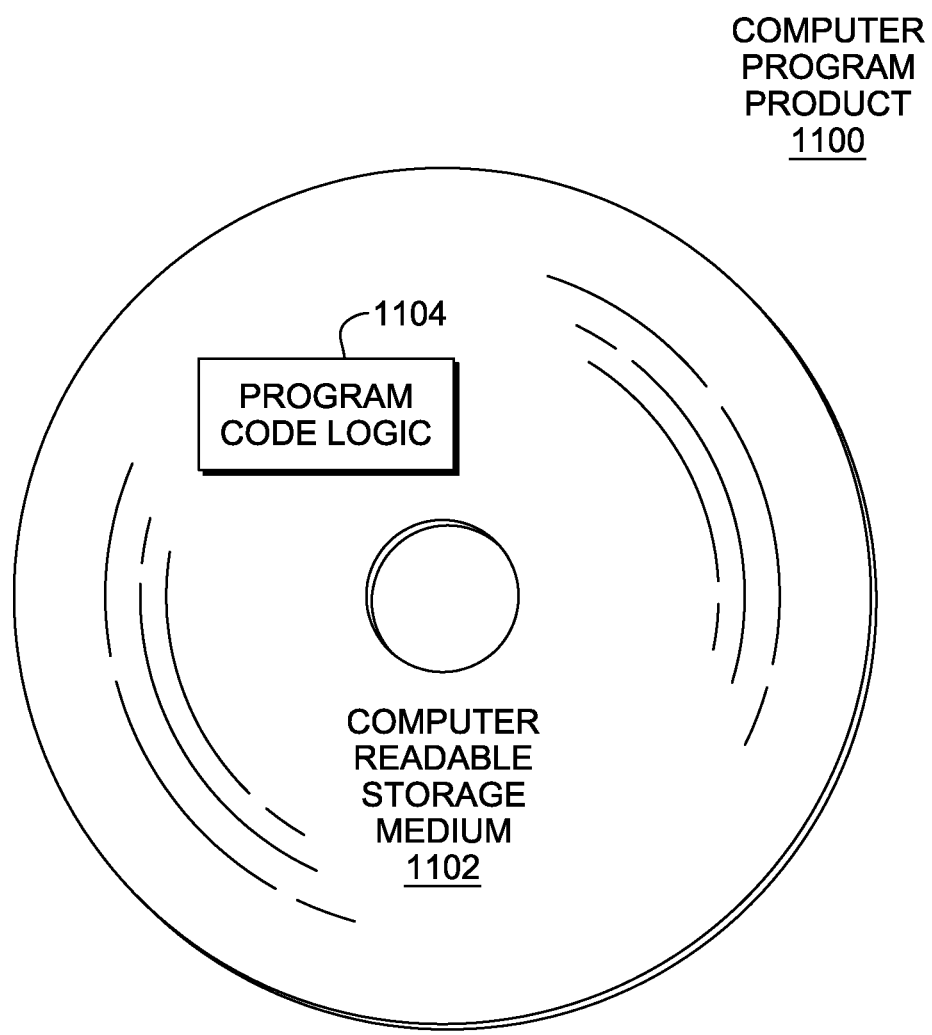
FIG. 11 depicts one embodiment of a computer program product incorporating one or more aspects of the present invention.

Referring now to FIG. 11, in one example, a computer program product 1100 includes, for instance, one or more non-transitory computer readable storage media 1102 to store computer readable program code means or logic 1104 thereon to provide and facilitate one or more aspects of the present invention.

Program code embodied on a computer readable medium may be transmitted using an appropriate medium, including but not limited to, wireless, wireline, optical fiber cable, RF, etc., or any suitable combination of the foregoing.

Computer program code for carrying out operations for one or more aspects of the present invention may be written in any combination of one or more programming languages, including an object oriented programming language, such as Java, Smalltalk, C++ or the like, and conventional procedural programming languages, such as the "C" programming language, assembler or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

One or more aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of one or more aspects of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In addition to the above, one or more aspects of the present invention may be provided, offered, deployed, managed, serviced, etc. by a service provider who offers management of customer environments. For instance, the service provider can create, maintain, support, etc. computer code and/or a computer infrastructure that performs one or more aspects of the present invention for one or more customers. In return, the service provider may receive payment from the customer under a subscription and/or fee agreement, as examples. Additionally or alternatively, the service provider may receive payment from the sale of advertising content to one or more third parties.

In one aspect of the present invention, an application may be deployed for performing one or more aspects of the present invention. As one example, the deploying of an application comprises providing computer infrastructure operable to perform one or more aspects of the present invention.

As a further aspect of the present invention, a computing infrastructure may be deployed comprising integrating computer readable code into a computing system, in which the code in combination with the computing system is capable of performing one or more aspects of the present invention.

As yet a further aspect of the present invention, a process for integrating computing infrastructure comprising integrating computer readable code into a computer system may be provided. The computer system comprises a computer readable medium, in which the computer medium comprises one or more aspects of the present invention. The code in combination with the computer system is capable of performing one or more aspects of the present invention.

Although various embodiments are described above, these are only examples. Further, other types of computing environments can benefit from one or more aspects of the present invention.

As a further example, a data processing system suitable for storing and/or executing program code is usable that includes at least one processor coupled directly or indirectly to memory elements through a system bus. The memory elements include, for instance, local memory employed during actual execution of the program code, bulk storage, and cache memory which provide temporary storage of at least some program code in order to reduce the number of times code must be retrieved from bulk storage during execution.

Input/Output or I/O devices (including, but not limited to, keyboards, displays, pointing devices, DASD, tape, CDs, DVDs, thumb drives and other memory media, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the available types of network adapters.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A control system for controlling operation of a cooling system cooling an electronic system, the control system comprising:
   a memory;
   a processor coupled to the memory, the processor and the memory being configured to facilitate performing:
      obtaining a respective cooling efficiency data model for each adjustable power-consuming cooling component of multiple different adjustable power-consuming cooling components of the cooling system to cool the electronic system, each cooling efficiency data model being a respective predetermined model relating, at least in part, for a current operating condition of the cooling system and the electronic system, a given adjustment in power to that adjustable power-consuming cooling component to a resultant change in a system target temperature of at least one of the cooling system or the electronic system while power to other adjustable power-consuming cooling components of the multiple different power-consuming cooling components remains unchanged;
      automatically determining, for the current operating condition of the cooling system and the electronic system, an adjusted control setting for a particular adjustable power-consuming cooling component of the multiple different adjustable power-consuming cooling components of the cooling system cooling the electronic system and affecting the system target temperature of at least one of the cooling system or the electronic system, wherein at least two adjustable power-consuming cooling components of the multiple different adjustable power-consuming cooling components have different cooling efficiencies, the automatically determining being based, at least in part, on a determination of power currently being consumed by the cooling system and a measurement of current ambient temperature of an air or water heat sink to which heat extracted by the cooling system is designed to be rejected, and wherein the automatically determining comprises using the cooling efficiency data models to dynamically determine for each adjustable power-consuming cooling component a respective partial derivative of anticipated change in system target temperature for an incremental change in cooling power consumed ($\delta T/\delta P$) during operation of the cooling system, and using the dynamically determined respective partial derivatives for the adjustable power-consuming cooling components in dynamically selecting the particular adjustable cooling component of the multiple adjustable power-consuming cooling components to adjust, wherein the dynamically selecting includes comparing the partial derivatives of the adjustable power-consuming cooling components to each other and selecting, based on the comparing of the partial derivatives, the particular adjustable power-consuming cooling component that maximizes at a current time cooling effectiveness of the cooling system for the incremental change in cooling power consumed; and applying the automatically determined adjusted control setting to the dynamically selected adjustable power-consuming cooling component.

2. The control system of claim 1, wherein the heat sink comprises outdoor ambient air, and the adjustable power-consuming cooling component comprises an adjustable coolant pump or adjustable fan, and wherein the processor and memory are further configured to facilitate the applying the automatically determined adjusted control setting to the adjustable power-consuming cooling component of the cooling system to incrementally reduce power consumption of the cooling system while ensuring that the system target temperature is within a desired range.

3. The control system of claim 1, wherein the system target temperature comprises a temperature of coolant within the cooling system cooling the electronic system, and wherein the automatically determined adjusted control setting ensures that the system target temperature remains within a desired range, the desired range being between a specified upper temperature for the system target temperature and a dew point temperature of the coolant within the cooling system, and wherein the automatically determining and the applying incrementally reduce power consumption of at least one of the cooling system or the electronic system while ensuring that the system target temperature is within the desired range.

4. A computer program product for controlling cooling of an electronic system, the computer program product comprising:

a non-transitory computer-readable storage medium readable by a processor and storing instructions for execution by the processor to perform:

obtaining a respective cooling efficiency data model for each adjustable power-consuming cooling component of multiple different adjustable power-consuming cooling components of the cooling system to cool the electronic system, each cooling efficiency data model being a respective predetermined model relating, at least in part, for a current operating condition of the cooling system and the electronic system, a given adjustment in power to that adjustable power-consuming cooling component to a resultant change in a system target temperature of at least one of the cooling system or the electronic system while power to other adjustable power-consuming cooling components of the multiple different power-consuming cooling components remains unchanged;

automatically determining, for the current operating condition of the cooling system and the electronic system, an adjusted control setting for a particular adjustable power-consuming cooling component of the multiple different adjustable power-consuming cooling components of the cooling system cooling the electronic system and affecting the system target temperature of at least one of the cooling system or the electronic system, wherein at least two adjustable power-consuming cooling components of the multiple different adjustable power-consuming cooling components have different cooling efficiencies, the automatically determining being based, at least in part, on a determination of power currently being consumed by the cooling system and a measurement of current ambient temperature of an air or water heat sink to which heat extracted by the cooling system is designed to be rejected, and wherein the automatically determining comprises using the cooling efficiency data models to dynamically determine for each adjustable power-consuming cooling component a respective partial derivative of anticipated change in system target temperature for an incremental change in cooling power consumed ($\delta T/\delta P$) during operation of the cooling system, and using the dynamically determined respective partial derivatives for the adjustable power-consuming cooling components in dynamically selecting the particular adjustable cooling component of the multiple adjustable power-consuming cooling components to adjust, wherein the dynamically selecting includes comparing the partial derivatives of the adjustable power-consuming cooling components to each other and selecting, based on the comparing of the partial derivatives, the particular adjustable power-consuming cooling component that maximizes at a current time cooling effectiveness of the cooling system for the incremental change in cooling power consumed; and applying the automatically determined adjusted control setting to the dynamically selected adjustable power-consuming cooling component.

5. The computer program product of claim 4, wherein the heat sink comprises outdoor ambient air, and the adjustable power-consuming cooling component comprises an adjustable coolant pump or adjustable fan, and wherein the computer-readable storage medium readable by the processor and storing instructions for the execution by the processor further performs the applying the automatically determined adjusted control setting to the adjustable power-consuming cooling component of the cooling system to incrementally reduce power consumption of the cooling system while ensuring that the system target temperature is within a desired range.

6. The computer program product of claim 4, wherein the system target temperature comprises a temperature of coolant within the cooling system cooling the electronic system, and wherein the automatically determined adjusted control setting ensures that the system target temperature remains within a desired range, the desired range being between a specified upper temperature for the system target temperature and a dew point temperature of the coolant within the cooling system, and wherein the automatically determining and applying incrementally reduce power consumption of at least one of the cooling system or the electronic system while ensuring that the system target temperature is within the desired range.

* * * * *